US010145928B2

(12) United States Patent
Liu

(10) Patent No.: US 10,145,928 B2
(45) Date of Patent: Dec. 4, 2018

(54) DIFFERENTIAL APPROACH TO QUANTITATIVE SUSCEPTIBILITY MAPPING WITHOUT BACKGROUND FIELD REMOVAL

(71) Applicant: MedImageMetric LLC, New York, NY (US)

(72) Inventor: Tian Liu, New York, NY (US)

(73) Assignee: MedImageMetric LLC, New York, NY (US)

( * ) Notice: Subject to any disclaimer, the term of this patent is extended or adjusted under 35 U.S.C. 154(b) by 1044 days.

(21) Appl. No.: 14/555,106

(22) Filed: Nov. 26, 2014

(65) Prior Publication Data

US 2015/0145515 A1 May 28, 2015

Related U.S. Application Data

(60) Provisional application No. 61/910,038, filed on Nov. 28, 2013.

(51) Int. Cl.
| | |
|---|---|
| *G01R 33/565* | (2006.01) |
| *G01R 33/24* | (2006.01) |
| *G01R 33/561* | (2006.01) |
| *G01R 33/56* | (2006.01) |
| *G01R 33/54* | (2006.01) |
| *G01R 33/483* | (2006.01) |

(52) U.S. Cl.
CPC ..... *G01R 33/56536* (2013.01); *G01R 33/243* (2013.01); *G01R 33/4835* (2013.01); *G01R 33/543* (2013.01); *G01R 33/5608* (2013.01); *G01R 33/5611* (2013.01)

(58) Field of Classification Search
CPC ........... G01R 33/5608; G01R 33/4835; G01R 33/5611; G01R 33/543; G01R 33/4828
USPC ........................................................ 324/309
See application file for complete search history.

(56) References Cited

U.S. PATENT DOCUMENTS

| | | | | |
|---|---|---|---|---|
| 4,849,210 A | * | 7/1989 | Widder .............. | A61K 49/1821 424/9.322 |
| 4,857,844 A | * | 8/1989 | Van Vaals .......... | G01R 33/4625 324/307 |

(Continued)

OTHER PUBLICATIONS

Poynton, Clare Clare Brenna. Quantitative susceptibility mapping and susceptibility-based distortion correction of echo planar images. Diss. Massachusetts Institute of Technology, 2012.*

(Continued)

*Primary Examiner* — Christopher McAndrew
(74) *Attorney, Agent, or Firm* — Fish & Richardson P.C.

(57) ABSTRACT

An example method for mapping tissue magnetic susceptibility includes acquiring magnetic resonance (MR) data, where the MR data correspond to a subject, determining a magnetic field based on the MR data, determining a relationship between the magnetic field at a given location to the magnetic susceptibility at that location, and performing a convolution operation on the relationship between the magnetic field at the given location to the magnetic susceptibility at that location to obtain a noise property. The method also includes estimating a magnetic susceptibility distribution of the subject based, at least in part, on the noise property, and generating one or more images of the subject based on the estimated susceptibility distribution of the subject.

39 Claims, 9 Drawing Sheets

(56) References Cited

U.S. PATENT DOCUMENTS

| | | | | |
|---|---|---|---|---|
| 5,055,791 A * | 10/1991 | LeRoux | G01R 33/24 | 324/309 |
| 5,071,602 A * | 12/1991 | Nambu | G01R 33/58 | 264/251 |
| 5,233,992 A * | 8/1993 | Holt | A61B 5/055 | 324/308 |
| 5,617,028 A * | 4/1997 | Meyer | G01R 33/56563 | 324/309 |
| 6,208,884 B1 * | 3/2001 | Kumar | A61B 5/04005 | 324/207.21 |
| 6,418,335 B2 * | 7/2002 | Avrin | A61B 5/04005 | 324/207.21 |
| 6,496,713 B2 * | 12/2002 | Avrin | A61B 5/04005 | 324/207.21 |
| 6,965,792 B2 * | 11/2005 | Avrin | A61B 5/04005 | 324/307 |
| 7,047,059 B2 * | 5/2006 | Avrin | A61B 5/04005 | 324/207.21 |
| 7,081,752 B2 * | 7/2006 | Skloss | G01R 33/58 | 324/318 |
| 7,395,108 B2 * | 7/2008 | Roopchansingh | G01R 33/56563 | 324/307 |
| 7,420,368 B2 * | 9/2008 | Miyazaki | G01R 33/4828 | 324/307 |
| 7,840,393 B1 * | 11/2010 | Whirley | G06G 7/48 | 703/11 |
| 8,034,634 B2 * | 10/2011 | Hong | G01N 27/74 | 436/518 |
| 8,224,632 B2 * | 7/2012 | Whirley | G06G 7/48 | 703/11 |
| 8,362,771 B2 * | 1/2013 | Dornhaus | G01R 33/243 | 324/309 |
| 8,421,459 B2 * | 4/2013 | Koch | G01R 33/243 | 324/300 |
| 8,447,089 B2 * | 5/2013 | Liu | A61B 5/055 | 324/309 |
| 8,710,840 B2 * | 4/2014 | Gross | G01R 33/565 | 324/309 |
| 8,712,499 B2 * | 4/2014 | Subramanian | G01N 24/08 | 600/407 |
| 8,754,645 B2 * | 6/2014 | Gross | G01R 33/50 | 324/307 |
| 8,854,038 B2 * | 10/2014 | Hernando | G01R 33/56563 | 324/307 |
| 8,957,681 B2 * | 2/2015 | Hernando | G01R 33/4828 | 324/309 |
| 9,213,076 B2 * | 12/2015 | Liu | G01R 33/56545 | |
| 9,250,307 B2 * | 2/2016 | Huwer | G01R 33/56341 | |
| 9,345,421 B2 * | 5/2016 | Peacock, III | G01R 33/4625 | |
| 9,664,761 B2 * | 5/2017 | Liu | A61B 5/055 | |
| 9,766,316 B2 * | 9/2017 | Sato | G01R 33/5608 | |
| 2003/0003053 A1 * | 1/2003 | Uetake | G01R 33/4828 | 424/9.3 |
| 2003/0210046 A1 * | 11/2003 | Wind | G01R 33/307 | 324/307 |
| 2006/0241382 A1 * | 10/2006 | Li | A61B 5/055 | 600/410 |
| 2007/0229070 A1 * | 10/2007 | Miyazaki | G01N 24/08 | 324/307 |
| 2008/0231271 A1 * | 9/2008 | Yui | G01R 33/5614 | 324/307 |
| 2009/0108843 A1 * | 4/2009 | Koch | G01R 33/5616 | 324/309 |
| 2010/0085050 A1 * | 4/2010 | Dong | G01R 33/243 | 324/309 |
| 2011/0050223 A1 * | 3/2011 | Balcom | G01R 33/305 | 324/307 |
| 2011/0103670 A1 * | 5/2011 | Koch | G01R 33/243 | 382/131 |
| 2011/0109309 A1 * | 5/2011 | Levy | G01R 33/4804 | 324/309 |
| 2011/0234221 A1 * | 9/2011 | Feiweier | G01R 33/56518 | 324/307 |
| 2012/0049846 A1 * | 3/2012 | Gross | G01R 33/565 | 324/309 |
| 2012/0068703 A1 * | 3/2012 | Gross | G01R 33/50 | 324/309 |
| 2012/0245453 A1 * | 9/2012 | Tryggestad | A61B 6/463 | 600/413 |
| 2012/0268121 A1 * | 10/2012 | Hernando | G01R 33/50 | 324/309 |
| 2013/0088231 A1 * | 4/2013 | Oliveira | G01R 33/583 | 324/314 |
| 2013/0119984 A1 * | 5/2013 | Levy | G01R 33/4804 | 324/309 |
| 2013/0214781 A1 * | 8/2013 | Hernando | G01R 33/4828 | 324/309 |
| 2013/0265046 A1 * | 10/2013 | Koch | G01R 33/56536 | 324/309 |
| 2014/0028314 A1 * | 1/2014 | Paul | G01R 33/387 | 324/309 |

OTHER PUBLICATIONS

Kressler, Bryan, et al. "Nonlinear regularization for per voxel estimation of magnetic susceptibility distributions from MRI field maps." IEEE transactions on medical imaging 29.2 (2010): 273-281. APA.*

Cheng, Yu-Chung N., Jaladhar Neelavalli, and E. Mark Haacke. "Limitations of calculating field distributions and magnetic susceptibilities in MRI using a Fourier based method." Physics in Medicine & Biology 54.5 (2009): 1169.*

De Rochefort, et al., *In vivo quantification of contrast agent concentration using the induced magnetic field for time-resolved arterial input function measurement with MRI*. Med Phys 35(12):5328-5339 (Dec. 2008).

De Rochefort, et al., *Quantitative susceptibility map reconstruction from MR phase data using bayesian regularization: validation and application to brain imaging*. Magn Reson Med 63(1):194-206 (Jan. 2010).

Haacke, et al., *Susceptibility mapping as a means to visualize veins and quantify oxygen saturation*, J Magn Reson Imaging 32(3):663-676 (Sep. 2010).

Kressler, et al., *Nonlinear regularization for per voxel estimation of magnetic susceptibility distributions from MRI field maps*. IEEE Transactions on Medical Imaging 29(2):273-281 (Feb. 2010).

Li, L., *Averaging of harmonic physical fields over an annular region enclosing field sources*. American Journal of Physics 70:1029-1033 (2002).

Li, et al., *Quantitative susceptibility mapping of human brain reflects spatial variation in tissue composition*. NeuroImage 55(4):1645-1656 (Apr. 2011).

Liu, et al., *Calculation of susceptibility through multiple orientation sampling (COSMOS): a method for conditioning the inverse problem from measured magnetic field map to susceptibility source image in MRI*. Magn Reson Med 61(1):196-204 (Jan. 2009).

Liu, et al., *Morphology enabled dipole inversion (MEDI) from a single-angle acquisition: comparison with COSMOS in human brain imaging*, Magn Reson Med 66(3):777-783 (Sep. 2011).

Liu, et al., *Morphology enabled dipole inversion for quantitative susceptibility mapping using structural consistency between the magnitude image and the susceptibility map*. NeuroImage 59(3):2560-2568 (Feb. 2012).

Liu, et al., *Nonlinear formulation of the magnetic field to source relationship for robust quantitative susceptibility mapping*. Magn Reson Med 69(2):467-476 (Feb. 2013).

Schweser, et al., *Differentiation between diamagnetic and paramagnetic cerebral lesions based on magnetic susceptibility mapping*. Med Phys 37(10):5165-5178 (Oct. 2010).

Schweser, et al., *Quantitative imaging of intrinsic magnetic tissue properties using MRI signal phase: an approach to in vivo brain iron metabolism?* NeuroImage 54(4):2789-2807 (Feb. 2011).

(56) References Cited

OTHER PUBLICATIONS

Schweser, et al., *Quantitative susceptibility mapping for investigating subtle susceptibility variations in the human brain*. NeuroImage 62(3):2083-2100 (Sep. 2012).

Shmueli, et al., *Magnetic susceptibility mapping of brain tissue in vivo using MRI phase data*. Magn Reson Med 62(6):1510-1522 (Dec. 2009).

Wharton, et al., *Susceptibility mapping in the human brain using threshold-based k-space division*. Magn Reson Med 63(5):1292-1304 (May 2010).

Wharton, et al., *Whole-brain susceptibility mapping at high field: a comparison of multiple- and single-orientation methods*. NeuroImage 53(2):515-525 (Nov. 2010).

Ghiglia, and Pritt, *Two-dimensional phase unwrapping: theory, algorithms, and software*. Wiley, New York (1998), pp. 188-194.

Jackson, J.D., *Classical Electrodynamics*, 3rd ed. Wiley, New York (1999), pp. 35-40.

\* cited by examiner

DIFFERENTIAL APPROACH TO QUANTITATIVE SUSCEPTIBILITY MAPPING WITHOUT BACKGROUND FIELD REMOVAL

RELATED APPLICATIONS

The present application claims priority from provisional U.S. Provisional Patent Application Ser. No. 61/910,038, filed Nov. 28, 2013.

STATEMENT REGARDING FEDERALLY SPONSORED RESEARCH AND DEVELOPMENT

"This invention was made with government support under Grant No. R43EB015293-01A1 awarded by the National Institutes of Health. The government has certain rights in this invention." This statement is included solely to comply with 37 C.P.R. § 401.14(f)(4) and should not be taken as an assertion or admission that the application discloses and/or claims only one invention.

TECHNICAL FIELD

This invention relates to magnetic resonance imaging, and more particularly to quantitatively mapping material intrinsic physical properties using signals collected in magnetic resonance imaging.

BACKGROUND

Quantitative susceptibility mapping (QSM) in magnetic resonance imaging (MRI) has received increasing clinical and scientific interest. QSM has shown promise in characterizing and quantifying chemical compositions such as iron, calcium, and contrast agents including gadolinium and superparamagnetic iron oxide (SPIO) nanoparticles. Tissue composition of these compounds may be altered in various neurological disorders, such as Parkinson's disease, Alzheimer's disease, stroke, multiple sclerosis, hemochromatosis, and tumor as well as other disease throughout the body. QSM is able to unravel novel information related to the magnetic susceptibility (or simply referred as susceptibility), a physical property of underlying tissue. Due to the prevalence of iron and calcium in living organisms, their active involvement in cellular signal transduction, their important roles in the musculoskeletal system, QSM is in general very useful to study the molecular biology of iron/calcium by tracking iron in the circulation system and the metabolic activities by using iron and calcium as surrogate marks. Therefore, accurate mapping of the magnetic susceptibility induced by iron, calcium and contrast agents will provide tremendous benefit to clinical researchers to probe the structure and functions of human body, and to clinicians to better diagnose various diseases and provide relevant treatment.

SUMMARY

Implementations of systems and methods for collecting and processing magnetic resonance (MR) signals of a subject, and reconstructing maps of physical properties intrinsic to the subject (e.g., magnetic susceptibility) are described below. In some implementations, MR signal data corresponding to a subject can be transformed into susceptibility-based images that quantitatively depict the structure and/or composition of the subject. Using this quantitative susceptibility map, one or more susceptibility-based images of the subject can be generated and displayed to a user. The user can then use these images for diagnostic or experimental purposes, for example to investigate the structure and/or composition of the subject, and/or to diagnose various conditions or diseases based, at least in part, on the images. As one or more of the described implementations can result in susceptibility-based images having higher quality and/or accuracy compared to other susceptibility mapping techniques, at least some of these implementations can be used to improve a user's understanding of a subject's structure and/or composition, and can be used to improve the accuracy of any resulting medical diagnoses or experimental analyses.

Some of the implementations described below can be used to evaluate the magnetic dipole inversion in its differential form while allowing incorporation of either Dirichlet or Neumann boundary conditions is disclosed to suppress artificial signal variation in homogenous region. In some cases, the boundary conditions are treated as prior information and enforced in a Bayesian method. The disclosed differential method bypasses the background field removal step, which often relies on phase unwrapping, skull stripping, and boundary conditions. The improved uniformity of susceptibility in homogenous region is especially helpful for choosing reference susceptibility, which is a pressing concern to ensure quantitation accuracy, experimental repeatability and reproducibility.

In general, in an aspect, a method for mapping tissue magnetic susceptibility includes acquiring magnetic resonance (MR) data, where the MR data correspond to a subject, determining a magnetic field based on the MR data, determining a relationship between the magnetic field at a given location to the magnetic susceptibility at that location, and performing a convolution operation on the relationship between the magnetic field at the given location to the magnetic susceptibility at that location to obtain a noise property. The method also includes estimating a magnetic susceptibility distribution of the subject based, at least in part, on the noise property, and generating one or more images of the subject based on the estimated susceptibility distribution of the subject.

In general, in another aspect, a system for mapping tissue magnetic susceptibility includes a processing module. The processing module is operable to acquire magnetic resonance (MR) data, where the MR data correspond to a subject, determine a magnetic field based on the MR data, determine a relationship between the magnetic field at a given location to the magnetic susceptibility at that location, and perform a convolution operation on the relationship between the magnetic field at the given location to the magnetic susceptibility at that location to obtain a noise property. The processing module is also operable to estimate a magnetic susceptibility distribution of the subject based, at least in part, on the noise property, and generate one or more images of the subject based on the estimated susceptibility distribution of the subject.

In general, in another aspect, a non-transitory computer storage medium is encoded with a computer program, the program including instructions that when executed by data processing apparatus cause the data processing apparatus to perform operations. The operations include acquiring magnetic resonance (MR) data, where the MR data correspond to a subject, determining a magnetic field based on the MR data, determining a relationship between the magnetic field at a given location to the magnetic susceptibility at that location, and performing a convolution operation on the relationship between the magnetic field at the given location to the magnetic susceptibility at that location to obtain a noise property. The operations also include estimating a magnetic susceptibility distribution of the subject based, at least in part, on the noise property, and generating one or more images of the subject based on the estimated susceptibility distribution of the subject.

Implementations of these aspects may include or more of the following features.

In some implementations, the relationship between the magnetic field at the given location to the magnetic susceptibility at that location can equate a Laplacian of the magnetic field with one third of the Laplacian of the magnetic susceptibility minus a second order derivative of the magnetic susceptibility.

In some implementations, performing the convolution operation can include convolving a Green's function with the relationship between the magnetic field at the given location to the magnetic susceptibility at that location.

In some implementations, performing the convolution operation can include convolving 1/r with the relationship between the magnetic field at the given location to the magnetic susceptibility at that location, where r is a distance from an origin in a three dimension space.

In some implementations, the noise property can correspond to noise in the magnetic field.

In some implementations, acquiring the MR data can include acquiring the MR data at multiple echo times.

In some implementations, acquiring the MR data can include acquiring the MR data at a single echo time.

In some implementations, the magnetic field can include a local magnetic field distribution superimposed on a background magnetic field distribution, wherein the local magnetic field distribution corresponds to the magnetic susceptibility distribution of the subject.

In some implementations, estimating the susceptibility distribution of the subject can include determining a cost function corresponding to a susceptibility distribution, the magnetic field, a mask corresponding to a region of interest, and a Green's function, determining a susceptibility distribution that minimizes the cost function, and identifying the susceptibility distribution that minimizes the cost function as the estimated susceptibility distribution of the subject. The cost function can include a convolution of a Green's function, the mask corresponding to the region of interest, and a Laplacian of the magnetic field. The cost function can further include a convolution of the Green's function, the mask corresponding to the region of interest, and a partial differential of the susceptibility distribution. Determining a susceptibility distribution that minimizes the cost function can include performing a least squares fitting based, at least in part, on the noise property.

In some implementations, the method can further include regularizing the estimated susceptibility distribution based on prior information regarding the subject. In some implementations, the processing module can be further operable to include regularizing the estimated susceptibility distribution based on prior information regarding the subject. In some implementations, the operations can further include regularizing the estimated susceptibility distribution based on prior information regarding the subject. Regularizing the estimated susceptibility distribution based on prior information regarding the subject can include determining boundary conditions associated with the subject.

The details of one or more embodiments are set forth in the accompanying drawings and the description below.

Other features and advantages will be apparent from the description and drawings, and from the claims.

$$\chi_L = 0 \text{ and } \frac{\partial \chi_L}{\partial n} = 0$$

are used as boundary conditions in DiffGT-DBC and DiffGT-NBC methods, respectively.

Figure 5B:
Figure 5D:
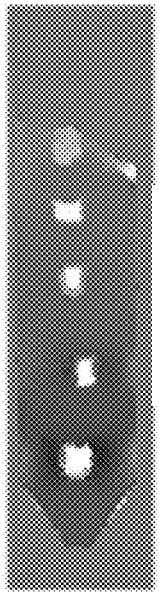
Figure 5F:
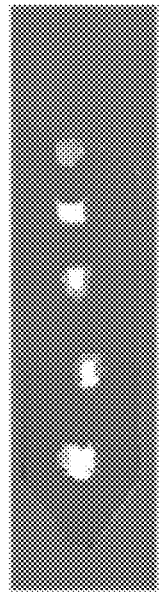
Figure 5H:
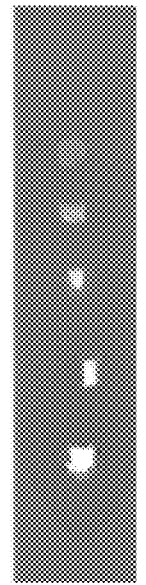
Figure 5A:
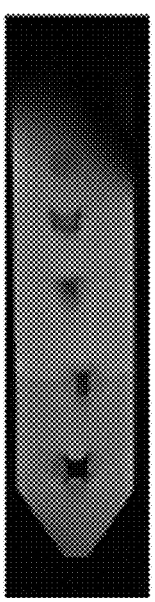

FIG. 5A shows an example magnitude component of the MRI signal collected from an agarose gel phantom with SPIO compartments using a gradient echo sequence.

FIG. 5B show an example estimated local field $f_L$ of the phantom shown in FIG. 5A.

Figure 5C:
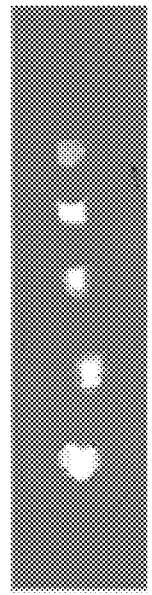
Figure 5E:
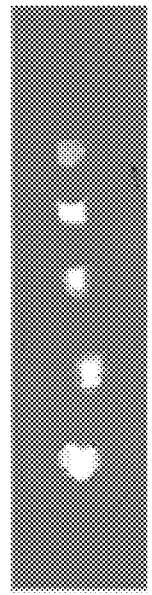
Figure 5G:
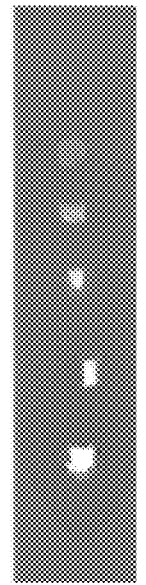

FIGS. 5C&D respectively show an example estimated susceptibility $\chi_L$ using the Intg and the Intg-DBC methods.

Some background variation is still seen originating from the high susceptibility SPIO compartments and the boundaries;

FIGS. 5E-H respectively show an example susceptibility $\chi_L$ using the Diff, DiffGT, DiffGT-DBC, and DiffGT-NBC methods. The background variation is largely reduced.

$$\chi_L = 0 \text{ and } \frac{\partial \chi_L}{\partial n} = 0$$

are used as boundary conditions in DiffGT-DBC and DiffGT-NBC methods, respectively.

Figure 6A:

FIG. 6A show in a sagittal plane an example magnitude component of the MRI signal collected from the brain of a human subject.

Figure 6B:
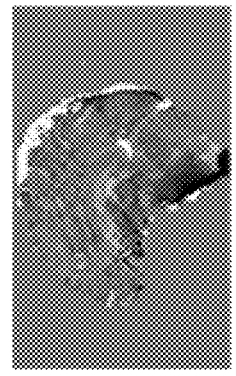
Figure 6E:
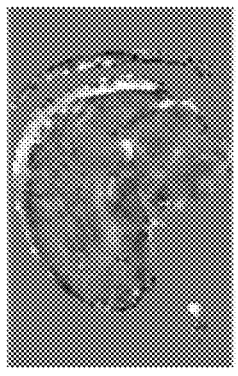
Figure 6H:
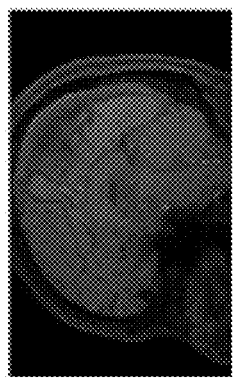

FIG. 6B show in the same sagittal plane of FIG. 6A an example local field map of the same subject.

Figure 6C:
Figure 6D:
Figure 6F:
Figure 6G:

FIGS. 6C&D respectively show an example estimated susceptibility $\chi_L$ using the Intg and the Intg-DBC methods.

FIGS. 6E-H respectively show an example estimated susceptibility $\chi_L$ using the Diff, DiffGT, DiffGT-DBC, and DiffGT-NBC methods.

$$\chi_L = 0 \text{ and } \frac{\partial \chi_L}{\partial n} = 0$$

are used as boundary conditions in DiffGT-DBC and DiffGT-NBC methods, respectively.

Figure 7B:
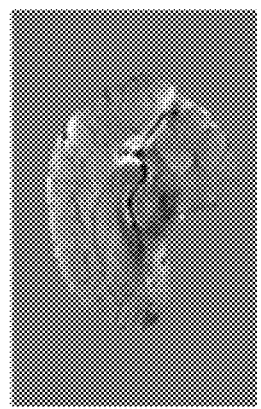
Figure 7D:
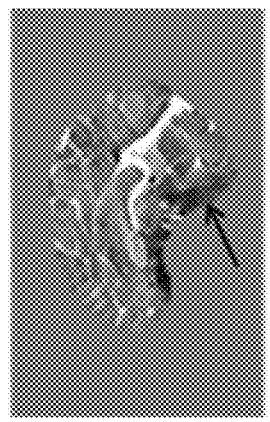
Figure 7A:
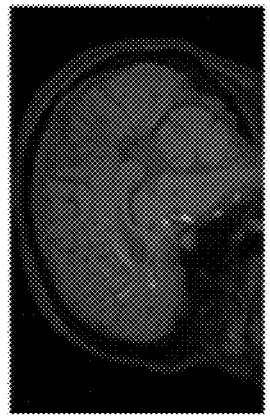

FIG. 7A show in a sagittal plane an example magnitude component of the MRI signal collected from the brain of another human subject.

FIG. 7B show in the same sagittal plane of FIG. 7A an example local field map of the same subject.

Figure 7C:
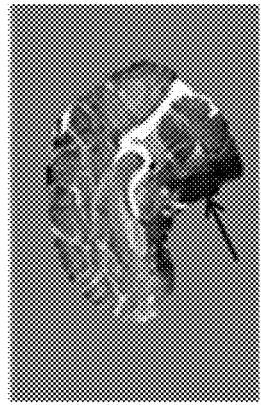

FIG. 7C show an example estimated susceptibility $\chi_L$ using the integration COSMOS method, where artifacts were seen originating from the boundary pointed by the arrow.

FIG. 7D show an example estimated susceptibility $\chi_L$ using the differential COSMOS method, where the artifacts were markedly suppressed (indicated by the arrow).

Figure 8:
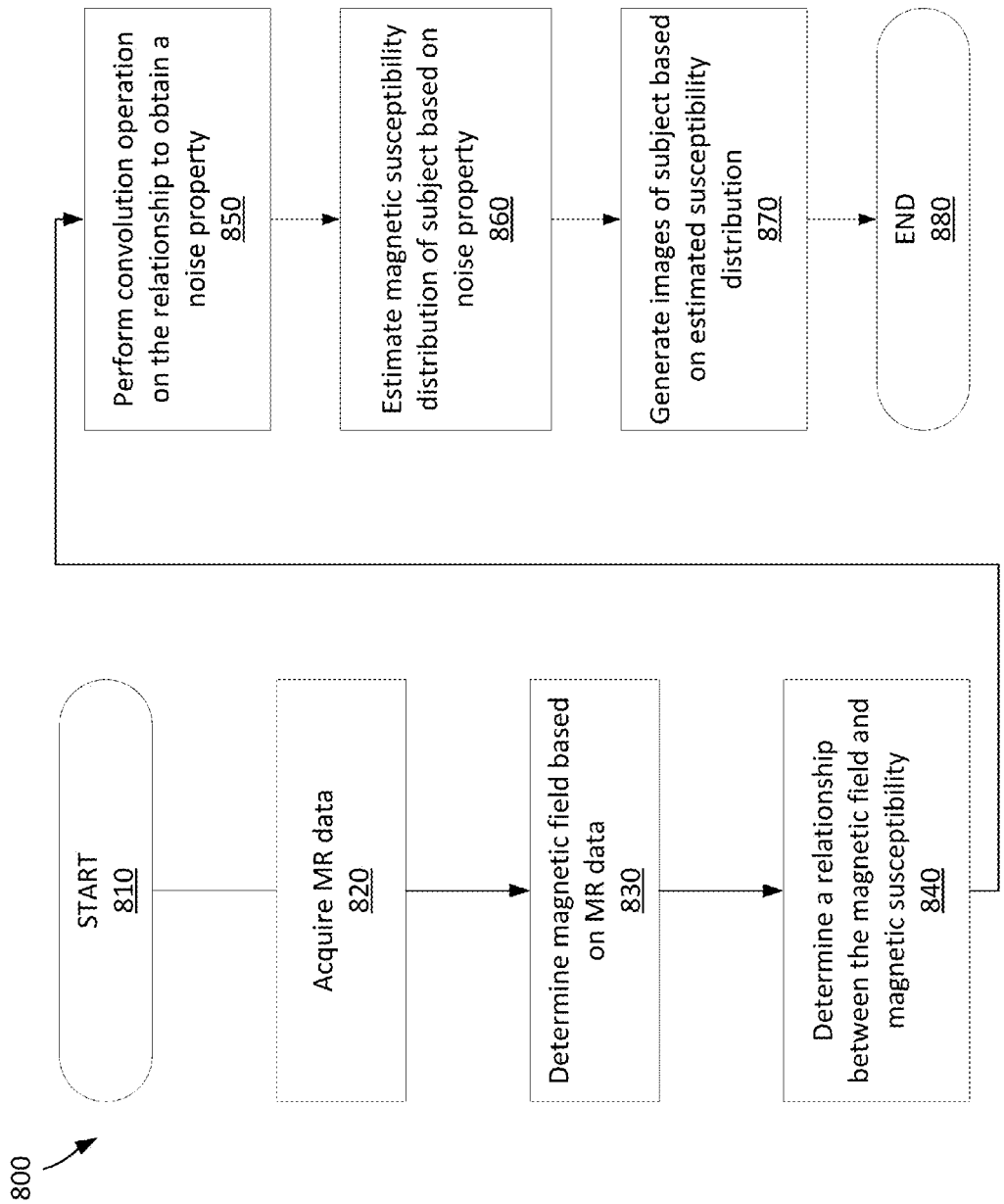

FIG. 8 shows an example process for mapping tissue magnetic susceptibility.

Figure 9:
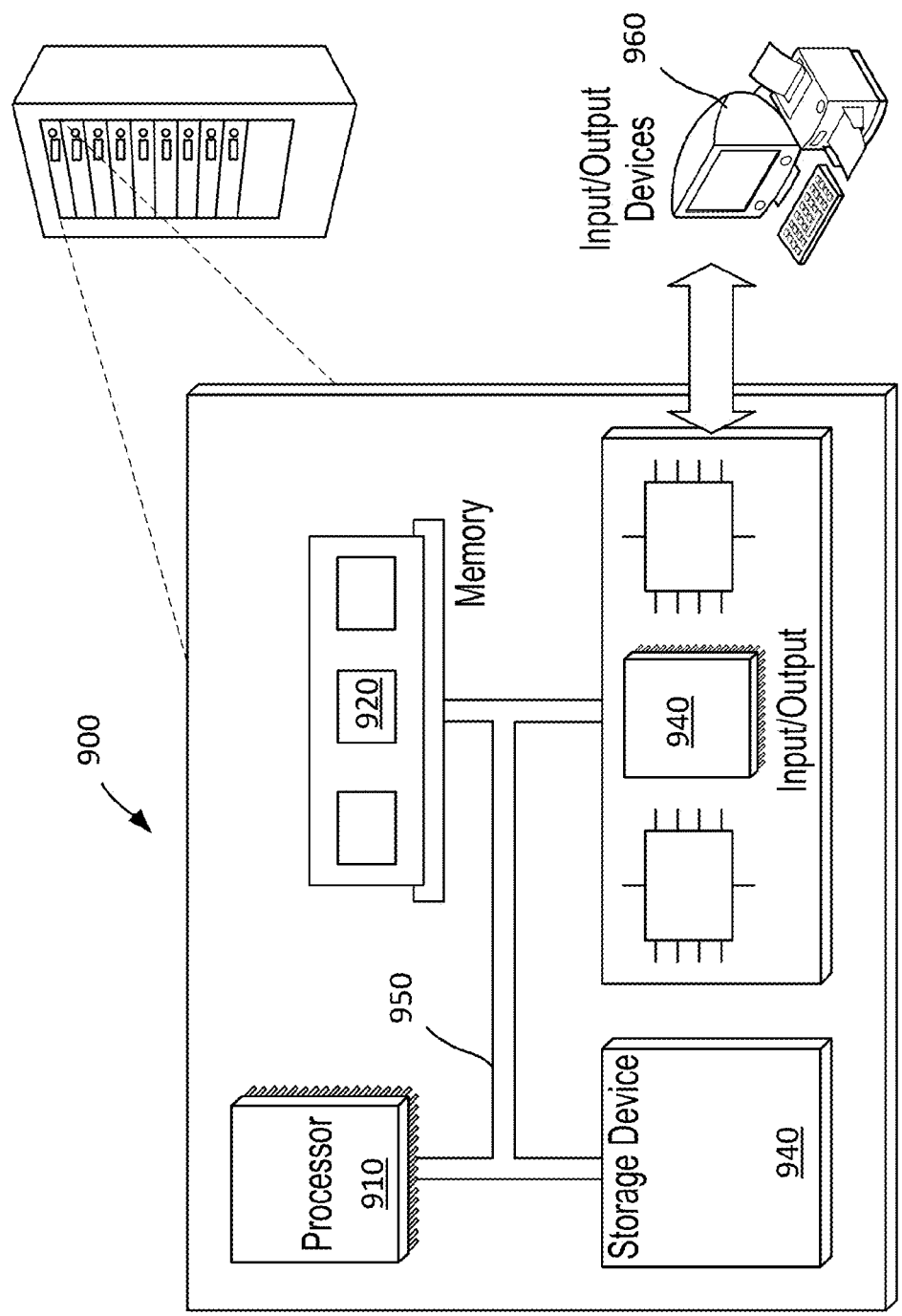

FIG. 9 is a block diagram of an example computer system.

Like reference symbols in the various drawings indicate like elements.

DETAILED DESCRIPTION

Implementations of systems and methods for collecting and processing MRI signals of a subject, and reconstructing maps of physical properties intrinsic to the subject (e.g., magnetic susceptibility) are described below. Some of the disclosed implementations overcome a limitation in quantitative susceptibility mapping, where the background field removal is not precise and the choice of reference susceptibility is subjective to operators' bias. In some implementations, to reconstruct maps of a subject's magnetic susceptibility, the dipole inversion is evaluated in its differential form, and in a manner that does not involve background field removal. In some cases, either Dirichlet or Neumann boundary conditions can be used as prior information in a Bayesian method for estimating susceptibility. Implementations of this differential QSM technique bypasses the background field removal required in some existing QSM methods, which may be prone to phase unwrapping errors, skull stripping errors, and boundary condition errors.

In quantitative susceptibility mapping (QSM), one pressing concern is how to choose the reference susceptibility. Since magnetic susceptibility is fundamentally determinable up to a constant, in many cases, it makes sense to use the susceptibility in a homogenous region as a reference. For example, in the calculation of susceptibility through multiple orientation sampling technique, surrounding water can be chosen as a reference and only the rate of susceptibility change (e.g., slope in linear regression) can be verified. In some cases, normal appearing white matter can be chosen as the reference and gray matter susceptibility can be measured relative to white matter susceptibility. In general, it is common to find a homogenous region in the imaging field of view, and then use the susceptibility value of this homogeneous region as reference susceptibility. But a practical problem is that there are artificial signal variations in the homogeneous region, making the choice of reference susceptibility subject to operators' selection bias. In addition, the pattern of these artifacts is case dependent. For example, in some cases, the structure of the object being imaged and imaging parameters can influence this artifactual inhomogeneity. In some cases, this poses a challenge to repeatability and reproducibility studies, which are often important in order to carry out longitudinal and/or multi-center comparison studies and ultimately for consistently making correct medical diagnoses.

Another pressing concern in QSM is how to remove background field precisely from the total measured field. Imperfect background field removal is often a significant cause for the erroneous non-uniform signal variation on reconstructed susceptibility maps, and in many cases, background field removal is an important step in current quantitative susceptibility mapping (QSM). However, high quality background field removal often relies on phase unwrapping, skull stripping, and knowledge of the field boundary conditions, which in many cases, may be difficult to obtain in practice.

In this disclosure, we demonstrate that the inversion of the dipole equation can be formulated as solving a hyperbolic partial differential equation exemplified by the wave equation, whose solutions are subject to initial conditions and boundary conditions. The missing boundary conditions give extra freedoms on the choice of Green's function for constructing the solution. In some cases, erroneously assumed boundary conditions in magnetic field estimation exacerbate the problem. To overcome this obstacle, we demonstrate techniques to evaluate the dipole inversion in its differential form while allowing incorporation of either Dirichlet or Neumann boundary conditions. To demonstrate the improvements provided by this technique, example numerical simulations, phantom imaging experiments, and human brain imaging experiments are shown.

To illustrate the quantitative mapping of absolute susceptibility, we present an analysis of the relationship between magnetic field and susceptibility in both integral forms and differential forms. The analysis signifies the boundary conditions in determining susceptibility, and demonstrates why, in some cases, existing techniques fail to provide accurate quantification when the background field cannot be accurately obtained. We further demonstrate a differential approach in quantitative susceptibility mapping (QSM) to bypass the background field removal step and strategies to incorporate boundary conditions. We describe implementations of our invention along with experimental results demonstrating their utility in several example applications.

1. Relationship Between Susceptibility and Magnetic Field

1.1. Integral Form

According to Maxwell's Equations, assuming the susceptibility distribution $\chi$ vanishes at infinity, the magnetic field (along B0 direction and scaled to B0) at a location r in tissue measured in MRI signal is $$f(r) = \int_{r \neq r'} \frac{1}{4\pi} \frac{3\cos^2\theta_{rr'} - 1}{|r - r'|^3} \chi(r') dr' = d(r) * \chi(r), \quad \text{Eq. 1}$$

where $\theta_{rr'}$ is the angle between the direction of the main magnetic field $B_0$ and the vector r-r', $$d(r) = \frac{1}{4\pi} \frac{3\cos^2\theta - 1}{|r|^3},$$

symbol * denotes convolution. For a predefined region of interest $\Omega$ with a local tissue susceptibility distribution $\chi_L(r)$, its exterior $\overline{\Omega} = \mathbb{R}^3 \setminus \Omega$ has a background susceptibility $\chi_B(r)$. $\mathbb{R}^3$ denotes the 3 dimensional space. Then f(r) is decomposable into two components $f(r) = d(r) * [\chi_L(r) + \chi_B(r)]$, where $\chi_L(r) = \chi(r)$ when $r \in \Omega$, and zero otherwise (the subscript L is used when the tissue domain $\Omega$ is not explicitly specified or the tissue domain property is emphasized) and $\chi_B(r) = \chi(r)$ when $r \in \overline{\Omega}$, and zero otherwise, or $$f(r) = f_L(r) + f_B(r), \quad \text{Eq. 2}$$

with $f_L(r)$ the field of local tissue (local field):

$$f_L(r) = \int_{r' \in \Omega \setminus r} \frac{1}{4\pi} \frac{3\cos^2\theta_{rr'} - 1}{|r - r'|^3} \chi(r') dr' = d(r) * \chi_L(r), \quad \text{Eq. 3}$$

and $f_B(r)$ the background field:

$$f_B(r) = \int_{r' \in \overline{\Omega}} \frac{1}{4\pi} \frac{3\cos^2\theta_{rr'} - 1}{|r - r'|^3} \chi(r') dr' = d(r) * \chi_B(r). \quad \text{Eq. 4}$$

For simplicity, the spatial index (r) may be dropped hereafter whenever clarity is not affected.

In some previous QSM techniques, it is desirable to estimate $f_L$, which is solely induced by the local susceptibility distribution $\chi_L$, the quantity of interest. Unfortunately, only the total f in Eq. 1 is measurable in MRI, and $f_L$ needs to be estimated from f. Although a number of solutions have been proposed exploiting the fact that $f_B$ is harmonic, e.g., $\nabla^2 f_B(r) = 0$ for $\forall r \in \Omega$, these solutions are often prone to large error because the boundary conditions are not specified. Following the derivation of the uniqueness theorem for Poisson's equation, it can be shown that the uniqueness is not guaranteed when the boundary condition is unspecified, even though the Laplacian of $f_L$ is known: $\nabla^2 f_L(r) = \nabla^2 f_B(r) + \nabla^2 f_L(r) = \nabla^2 f(r)$ for $\forall r \in \Omega$. It is also noticed that the difference between the estimated local field $f_L^*$ and the true local field $f_{L0}$ fulfills $\nabla^2 f_L^*(r) - \nabla^2 f_{L0}(r) = 0$, for $\forall r \in \Omega$. So $f_L^*$ can be expressed as $f_L^* = f_{L0} + f_{B,h}$, where the bias field $f_{B,h}$ is a harmonic function in $\Omega$.

The bias field also propagates to the estimation of $\chi_L$. So instead of searching for a physically meaningful susceptibility distribution $\chi_{L0}$ that is responsible for $f_{L0}$, the estimated $\chi_L^*$ now corresponds to $f_{L0} + f_{B,h}$. A necessary condition for accurate estimate of tissue susceptibility $\chi_L^* = \chi_{L0}$ is $d * \chi_L^* = d * \chi_{L0} \Rightarrow f_{L0} + f_{B,h} = f_{L0} \Rightarrow f_{B,h} = 0$, which cannot be fulfilled when the boundary condition for $f_B$ is not specified. Therefore, the estimate $\chi_L^*$ is also inaccurate when boundary conditions are not considered.

Following the above analysis, it can be shown that $$\forall r \in \Omega, \nabla^2 f(r) = \nabla^2 f_L(r) = \nabla^2[\chi_L(r) * d(r)] = d(r) * [\nabla^2 \chi_L(r)]. \quad \text{Eq. 5}$$

$\nabla^2 \chi_L$ may be determined from $\nabla^2 f(r)$ using a regularized deconvolution as in current QSM methods, such as the morphology enabled dipole inversion (MEDI) algorithm. Unlike the relationship in Eq. 1 where f is connected to all susceptibility $\chi$ in space, necessitating background field removal, the measured total field laplacian $\nabla^2 f$ is directly linked to the tissue susceptibility $\nabla^2 \chi_L(r)$ in Eq. 1 is now per location r based, eliminating the need for background field removal. Then, from $\nabla^2 \chi_L$, accurate $\chi_L$ can be estimated using the known boundary condition for $\chi_L$ or a regularization or a combination of boundary condition and regularization.

An example is shown in FIG. 1, where the error in the biased local field (FIG. 1C) propagated into the calculated susceptibility (FIG. 1D), preventing any useful interpretation of the susceptibility map.

1.2. Differential Form

Differentiation of Eq. 1 leads to the following differential form, which can also be derived directly from Maxwell's Equations, that $$\nabla^2 f(r) = \left(\frac{1}{3}\nabla^2 - \frac{\partial^2}{\partial z^2}\right)\chi(r) = \frac{1}{3}\left(\nabla^2_{x,y} - \frac{1}{(\sqrt{0.5})^2}\frac{\partial^2}{\partial z^2}\right)\chi(r) \stackrel{def}{=} P\chi, \quad \text{Eq. 6}$$

$$\text{where}\left(\frac{1}{3}\nabla^2 - \frac{\partial^2}{\partial z^2}\right)$$

is a differential dipole operator, $\nabla^2_{x,y}$ denotes the Laplace operator on x and y axes only, which are orthogonal to the direction of the main magnetic field represented by z. This partial differential operator is denoted as P. It is recognized that this is an inhomogeneous wave equation.

Unlike the relationship in Eq. 1 where f is connected to all susceptibility $\chi$ in space, necessitating background field removal, the relationship between the measured total field laplacian $\nabla^2 f$ and tissue susceptibility $\chi$ in Eq. 6 is now per location r based, eliminating the need for background field removal.

Without regularization, without boundary conditions and by superposition principles, any homogenous solution to the homogenous wave equation $$\left(\nabla^2_{x,y} - \frac{1}{(\sqrt{0.5})^2}\frac{\partial^2}{\partial z^2}\right)\chi_{L,h} = 0$$

can be added to the inhomogeneous solution, where the homogeneous solutions take the form of:

$$\chi_{L,h}(x, y, z) = \int_{-\infty}^{\infty}\int_{-\infty}^{\infty} \eta_1(k_x, k_y) e^{i\sqrt{0.5(k_x^2 + k_y^2)}z} e^{ik_x x} e^{ik_y y} dk_x dk_y + \int_{-\infty}^{\infty}\int_{-\infty}^{\infty} \eta_2(k_x, k_y) e^{-i\sqrt{0.5(k_x^2 + k_y^2)}z} e^{ik_x x} e^{ik_y y} dk_x dk_y, \quad \text{Eq. 7}$$

where $\eta_1(k_x,k_y)$ and $\eta_2(k_x,k_y)$ can be arbitrary complex functions define in a 2-dimension plane $\mathbb{R}^2$ that can be determined using boundary conditions or regularizations.

2. Solving Field-to-source Inversion in its Differential Form

In this section, we present techniques to improve image quality and quantitative accuracy by formulating the dipole inversion problem in its differential form. An analytical solution to incorporate the boundary conditions is illustrated using Green's Theorem. The boundary conditions can also be incorporated as a priori information in a Bayesian method. Concepts and approaches are presented below.

2.1. Concepts

It is understood from the previous analysis of current QSM based on the integral form Eq. 1 that the boundary value problem exists in the estimation of $f_L$, the input argument for calculation of $\chi_L$. In many cases, it is desirable to provide boundary conditions for $f_L$ to minimize any bias field $f_{B,h}$ before it propagates to $\chi_L$. However, this approach generally requires knowledge of $f_L$ on $\partial\Omega$, the surface of $\Omega$, but this knowledge is often unavailable because the magnetic field at a spatial location is an integral of susceptibility distribution over the entire space (Eq. 1), and it further depends on the orientation with respect to the main magnetic field.

The following insights have been obtained from the analyses of the relationship between the measured field f and the susceptibility in tissue region $\Omega$.

First, it is noted that in a noiseless scenario, for every point r inside $\Omega$, there is a linear relationship between $\nabla^2 f$ and $\nabla^2 \chi_L$ (Eq. 5): $\nabla^2 f = d * \nabla^2 \chi_L$, and similarly, an equality connection between $\nabla^2 f$ and $\chi_L$ (Eq. 6): $\nabla^2 f = P\chi_L$. Note that $\nabla^2 f$ is the Laplacian applied on f, the total field directly measurable in MRI. This field-source relationship enables the estimation of $\chi_L$ without the background field removal.

Second, since noise typically exists in measured data, the unknown $\chi_L$ often needs to be estimated in a statistically optimal way. Generally speaking, if the probability density function of the noise $\mathcal{N}$ contained in $f = d * \chi + \mathcal{N}$ is known, a maximum likelihood estimation leads to the optimal solution. However, the Laplace operator changes the noise property contained in $\nabla^2 f = d * \nabla^2 \chi + \nabla^2 \mathcal{N}$ or equivalently $\nabla^2 f = P\chi + \nabla^2 \mathcal{N}$, requiring additional considerations to accommodate the noise.

Fortunately, the Laplace operator has properties described by the Green's Theorem, which allows restoration of noise properties. The Green's third identity relates $\nabla^2 f$ to f by a volume integral with an additional harmonic term:

$$f(r) = \int_\Omega \frac{1}{R} \nabla^2 f(r') d^3 r' + \oint_{\partial\Omega} \left[ -f(r') \frac{\partial}{\partial n'} \frac{1}{R} + \frac{1}{R} \frac{\partial f(r')}{\partial n'} \right] da', \quad \text{Eq. 8}$$

where $R=|r-r'|$ and $\partial/\partial n'$ denotes the normal derivative. Here the first term $f_{nh}(r) = \int_\Omega \nabla^2 f(r')/R d^3 r' = \nabla^2 f(r)|_\Omega * 1/r$ is non-harmonic because $\nabla^2 f_{nh} = \nabla^2 f$. The second term $$f_h(r) = \oint_{\partial\Omega} \left[ -f(r') \frac{\partial}{\partial n'} \frac{1}{R} + \frac{1}{R} \frac{\partial f(r')}{\partial n'} \right] da'$$

is harmonic inside $\Omega$. Since harmonic functions are smoothly varying functions and noise is randomly varying in space, noise projects little onto the harmonic part and projects mostly onto the non-harmonic part, e.g., $f_h$ is noiseless and $f_{nh} = 1/r * \nabla^2 f|_\Omega$ have similar noise properties to that in f. This is equivalent to say that the transformation operation $1/r * \nabla^2|_\Omega$ preserves the noise property.

Another way to account for the changed noise property in $\nabla^2 \mathcal{N}$ is to explicitly calculate its probability density function, which is elaborated in 3.3.1.

2.2. Approaches

For the sake of clarity, it is assumed here that the noise in consideration is independently and identically distributed (i.i.d.) zero-mean Gaussian noise. This restriction will be removed when dealing with actual signal collected from MRI, for example as described in Section 3.3.

2.2.1. Green's Theorem

One way to obtain $\chi_L$ over the entire $\Omega$ is to obtain $\nabla^2 \chi_L$ inside $\Omega$, then solve a Poisson's Equation by utilizing the prior knowledge of $\chi_{L0}$ on $\partial\Omega$.

From the above analyses, a statistical optimal solution that properly accounts for the i.i.d. Gaussian noise contained in f can be found by solving the following least-squares minimization problem:

$$E(\chi'_L) = \left\| (d * \chi'_L - f') \right|_\Omega * \frac{1}{r} \right\|_\Omega^2, \quad \text{Eq. 9}$$

where $\chi'_L = \nabla^2 \chi_L$, $f' = \nabla^2 f$, and $\|s\|_\Omega^2$ denotes the square of the L2 norm of s over the domain $\Omega$.

The least-squares minimization also inspires the following formulation:

$$E(\chi'_L) = \|d * \chi'_L - f'\|_\Omega^2, \quad \text{Eq. 10}$$

which has a simpler appearance. The solution $\chi'^*_L$ is optimal when the noise contained in f' is i.i.d. Gaussian.

Since both Eq. 9 and Eq. 10 can be used to find an optimal solution, the choice of the formulations depends on the actual noise property associated with the measurement, e.g., whether Gaussian noise is associated with f or f'. Now we continue our derivation with Eq. 9, but with the understanding that Eq. 10 can be used to replace Eq. 9 when it is more appropriate.

Sometimes, minimizing the energy functions Eq. 9 or Eq. 10 alone is not sufficient to find a unique solution. It has been demonstrated in prior art that deconvolution of the dipole kernel d is an ill-posed problem with infinitely many $\chi'_L$ fulfilling $d * \chi'_L = f'$. In other words, there are infinitely many $\chi'_L$ that can give a same minimum to the energy function in Eq. 9 or Eq. 10. One way to obtain a unique $\chi'_L$ is to add a regularization term $R(\chi'_L)$ in the energy function, such that:

$$\chi'^*_L = \quad \text{Eq. 11}$$
$$\operatorname{argmin}_{\chi'_L} E(\chi'_L) = \operatorname{argmin}_{\chi'_L} \left\| (d * \chi'_L - f') \right|_\Omega * \frac{1}{r} \right\|_\Omega^2 + \alpha R(\chi'_L),$$

Another way to obtain a unique $\chi'_L$ is by oversampling the field f from more than 2 different orientations with respect to the direction of the main magnetic field:

$$\chi'^*_L = \operatorname{argmin}_{\chi'_L} E(\chi'_L) = \operatorname{argmin}_{\chi'_L} \sum_{\vartheta=1}^{N} \left\| (d_\vartheta * \chi'_L - f'_\vartheta) \right|_\Omega * \frac{1}{r} \right\|_\Omega^2, \quad \text{Eq. 12}$$

where $N \geq 3$, $d_\vartheta$ and $f'_\vartheta$ are the dipole kernels and fields at the corresponding orientation.

Once $\chi'^*_L$ is obtained, applying Green's Theorem again with the knowledge of $\chi_{L0}$ and $$\frac{\partial \chi_{L0}(r')}{\partial n'}$$

at the boundary leads to $\chi^*_L(r)$:

$$\chi^*_L(r) = \int_\Omega \frac{1}{R} \chi'^*_L(r') dr' + \oint_{\partial \Omega} \left[ -\chi_{L0}(r') \frac{\partial}{\partial n'} \frac{1}{R} + \frac{1}{R} \frac{\partial \chi_{L0}(r')}{\partial n'} \right] da', \quad \text{Eq. 13}$$

2.2.2. Formulation Using Bayesian Method

Direct application of the Green's theorem to find $\chi^*_L$ generally requires knowledge of both Dirichlet Boundary Condition (DBC) $\chi_{L0}$ and Neumann Boundary Condition (NBC)

$$\frac{\partial \chi_{L0}(r')}{\partial n'}.$$

However, uniqueness of the solution is guaranteed with either Dirichlet or Neumann boundary condition. One way to incorporate either or both boundary conditions is to formulate the problem using a Bayesian method:

$$\chi^*_L = \operatorname{argmin}_{\chi_L} \left\| (d * \nabla^2 \chi_L - \nabla^2 f) \Big|_\Omega * \frac{1}{r} \right\|^2_\Omega + \quad \text{Eq. 14}$$

$$\alpha R(\chi_L) + \beta \|\chi_L - \chi_{L0}\|^2_{\partial\Omega} + \gamma \left\| \frac{\partial \chi_L}{\partial n'} - \frac{\partial \chi_{L0}}{\partial n'} \right\|^2_{\partial\Omega},$$

Here, the first data fidelity term ensures that the solution is faithful to the measurement in its differential form; the second term is a regularization term to avoid multiple candidate solutions giving a same minimum to this energy function with α being the regularization parameter controlling its weighting in the energy function; the third and fourth terms are the boundary terms. When combined with large Lagrangian multipliers β, γ>>1, they effectively enforces $$\chi_L = \chi_{L0} \text{ and } \frac{\partial \chi_L}{\partial n'} = \frac{\partial \chi_{L0}}{\partial n'}$$

on $\partial\Omega$; When a boundary condition is unavailable, the corresponding Lagrangian multiplier could be set to zero.

If fields sampled from multiple orientations are available, it is also possible to formulate the minimization in the following way without the regularization term $R(\chi_L)$:

$$\chi^*_L = \operatorname{argmin}_{\chi_L} \sum_{\vartheta=1}^N \left\| (d_\vartheta * \nabla^2 \chi_L - \nabla^2 f_\vartheta) \Big|_\Omega * \frac{1}{r} \right\|^2_\Omega + \quad \text{Eq. 15}$$

$$\beta \|\chi_L - \chi_{L0}\|^2_{\partial\Omega} + \gamma \left\| \frac{\partial \chi_L}{\partial n'} - \frac{\partial \chi_{L0}}{\partial n'} \right\|^2_{\partial\Omega}.$$

3. Numerical Implementation

Figure 1A:
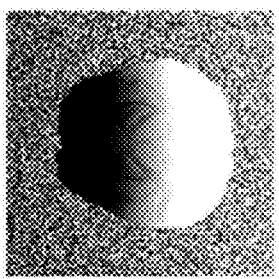
FIG. 1A shows in axial view an example local susceptibility distribution $\chi_L$ in a numerical brain.
Figure 1B:
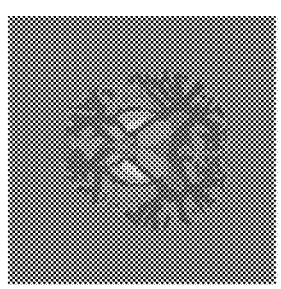
FIG. 1B shows in axial view an example local magnetic field $f_L$ induced by $\chi_L$ shown in FIG. 1A.
Figure 1C:
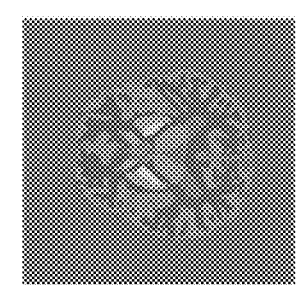
FIG. 1C shows in axial view an example superimposition of the local magnetic field $f_L$ in FIG. 1B and a harmonic bias field $f_{B,h}$. This field is used in the comparison of various reconstruction methods.
Figure 1D:
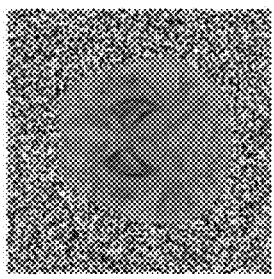
FIGS. 1D&E respectively show in axial view an example estimated susceptibility $\chi^*_L$ using the integral method (Intg) and the Intg with Dirichlet boundary condition (Intg-DBC) methods, resulting in uninterpretable QSM due to the large background variation.
Figure 1E:
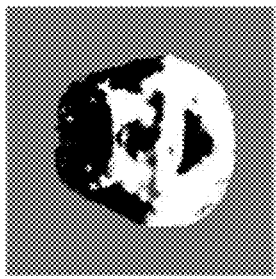
FIGS. 1F-I respectively show in axial view an example estimated susceptibility $\chi^*_L$ using the differential method (Diff), Diff with Green's Theorem (DiffGT), DiffGT-DBC, and Diff with Neumann boundary condition (DiffGT-NBC) methods. These methods successfully removed the large background variation.
Figure 1F:
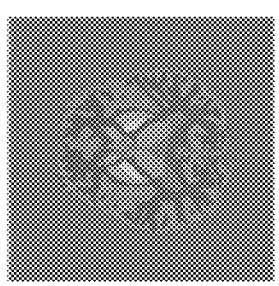
Figure 1G:
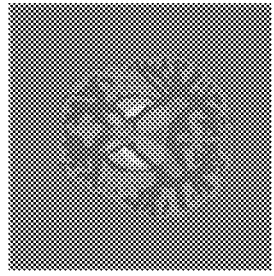
Figure 1H:
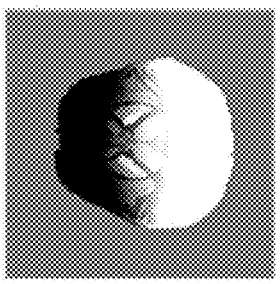
Figure 1I:
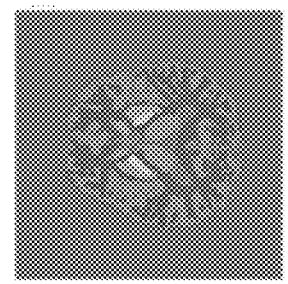
Figure 2:
FIG. 2 shows an example differential process for quantitative mapping of susceptibility.

In some implementations, the relationships above can be solved numerically. As an example, FIG. 2 shows a process 200 for mapping tissue magnetic susceptibility numerically. In this example, continuous spatial location r is discretized onto regular grid as well as all the functions taking r as a parameter. The discrete versions of continuous operations are described below.

3.1. I) Dipole Convolution

The spatial convolution $d*\chi$ is expressed as $D\chi$, where D is a matrix representing the dipole convolution, and can be efficiently calculated in Fourier space. In an example implementation, $D=F^{-1}\operatorname{diag}(\Lambda)F$, where $F^{-1}$ and F are inverse and forward 3-dimensional Fourier transforms, $\operatorname{diag}(\Lambda)$ denotes a diagonal matrix whose elements are $\Lambda$, and $\Lambda=\operatorname{vec}(1/3-k_z^2/k^2)$ denotes a vector whose elements are $1/3-k_z^2/k^2$, where vec denotes a vectorization operator, k denotes the Fourier space coordinates and $k_z$ denotes the direction of the main magnetic field. In another embodiment, $D=F^{-1}\operatorname{diag}(\Lambda)F$, where $$\Lambda = \operatorname{vec}\left[F\left(\frac{1}{4\pi} \frac{3(\hat{r}\cdot\hat{z})^2 - 1}{r^3}\right)\right] \text{ with } r = \sqrt{x^2 + y^2 + z^2}.$$

3.2. II) Laplace Operator and Other Differential Operators

Similar to the dipole convolution, the Laplace operator $\nabla^2 \chi$ is expressed as $L\chi$, where L is a matrix representing the Laplacian, and can be efficiently evaluated in Fourier space with $L=F^{-1}\operatorname{diag}[\operatorname{vec}(-k^2)]F$, or $L=F^{-1}\operatorname{diag}[\operatorname{vec}(F(\mathcal{L}))]F$, where $\mathcal{L}$ is the discrete Laplace operator applied on a Dirac delta function in image space. In one embodiment, $\mathcal{L}$ is implemented using the finite difference method to approximate derivatives, e.g., the $2^{nd}$ order derivative along xis approximated as $\partial^2\phi/\partial x^2=[(\phi(x+h)-\phi(h))-(\phi(h)-\phi(x-h))]/h^2$, where h is the distance between neighboring grid points along x. The finite difference implementation of $\nabla^2 f$ also allows simultaneous correction of phase wraps on f by adding multiples of $2\pi$ to the differences of neighboring voxels (e.g. $\phi(x+h)-\phi(h)$ and $\phi(h)-\phi(x-h)$, respectively), such that the corrected differences fall in $(-\pi,\pi]$.

In another example implementation, $\mathcal{L}$ is approximated by taking the difference between a certain voxel and the spherical mean value (SMV) of its surrounding voxels within a certain radius: $(\delta(r)-s(r))*\phi$, where $\delta(r)$ is a Dirac delta function, $s(r)$ is equal to $1/(4/3\pi R_0^3)$ when $|r|<R_0$ and 0 otherwise. The convolution can be efficiently carried out in Fourier space as well through $L=F^{-1}\operatorname{diag}[\operatorname{vec}(F(\delta-s))]F$.

The operator $d*\nabla^2\chi=P\chi$ is implemented in one embodiment by combining the dipole convolution and Laplace operator, which may be expressed as $DL=F^{-1}\operatorname{diag}[\operatorname{vec}(\Lambda)]\operatorname{diag}[\operatorname{vec}(-k^2)]F$, or $DL=F^{-1}\operatorname{diag}[\operatorname{vec}(\Lambda)]\operatorname{diag}[\operatorname{vec}(F(\mathcal{L}))]F$. In another example implementation: $P=F^{-1}\operatorname{diag}[\operatorname{vec}(\mathcal{D})]F$, where $\mathcal{D}$ is the discrete differential dipole operator in image space as in Eq. 6 with the second order derivatives implemented using the finite difference methods. Since $d*\nabla^2\chi_L=P\chi_L$ and for the sake of simplicity, we use $P\chi_L$ to denote both $P\chi_L$ and $DL\chi_L$ hereafter unless specifically indicated otherwise.

3.3. III) Evaluation of the Data Fidelity Term in the Presence of Noise

The process 200 begins by setting up a data fidelity term (step 220).

Figure 3B:
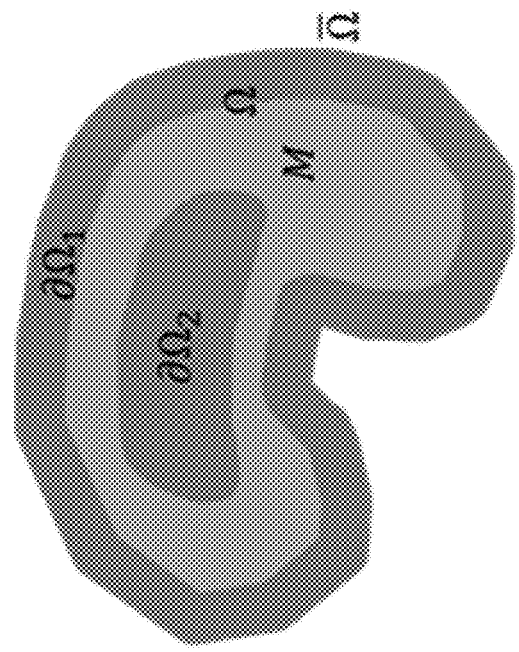
FIG. 3B shows another example configuration of the region of interest $\Omega$. While $\Omega$, $\overline{\Omega}$ and M have the same definitions as in FIG. 3A, the boundary $\partial\Omega$ includes both an outer boundary region $\partial\Omega_1$ and an inner boundary region $\partial\Omega_2$. Note the boundary region is not restricted to a single layer of voxels and may be a 3 dimensional volume.
Figure 3A:
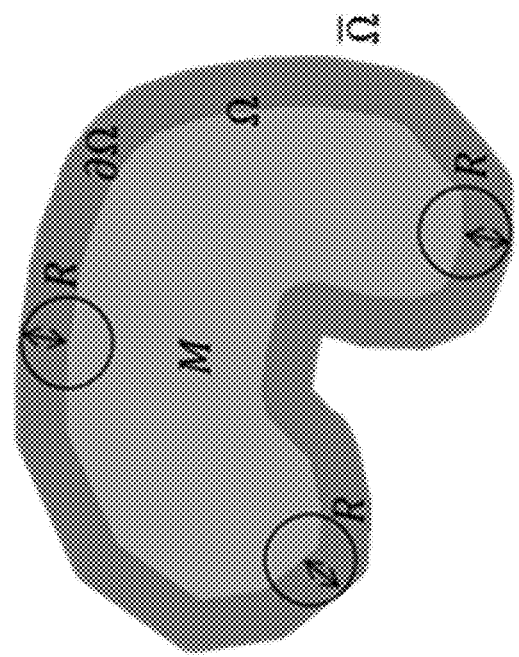
FIG. 3A shows an example region of interest $\Omega$ in gray areas (including light and dark gray), and its exterior $\overline{\Omega}$ in white area. The binary mask M (light gray area) is defined as the largest region where the distance between any pair of points in M and $\overline{\Omega}$ is at least R, such that the resulting Laplacian of the field, $\nabla^2 f$, is guaranteed not to be corrupted by the noise in $\overline{\Omega}$. In this example, $\partial\Omega$ coincides with ($\Omega$-M) and is denoted using dark gray.
Figure 4A:
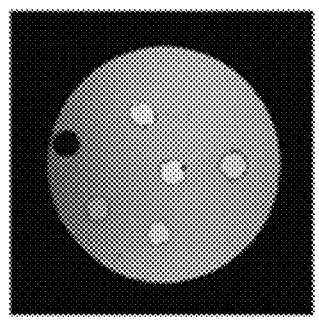
FIG. 4A shows an example magnitude component of the MRI signal collected from a water phantom with Gadolinium doped balloons using a gradient echo sequence.
Figure 4B:
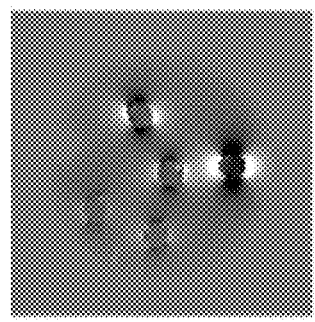
FIG. 4B shows an example estimated local field $f_L$ of the phantom shown in FIG. 4A.
Figure 4C:
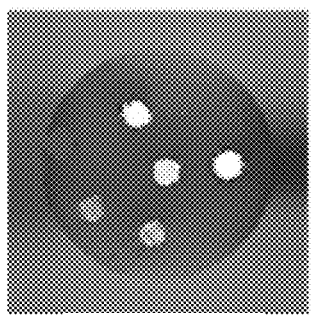
FIGS. 4C&D respectively show an example susceptibility $\chi_L$ using the Intg and the Intg-DBC methods. Some background variation is still seen originating from the high susceptibility balloons and the boundaries.
Figure 4D:
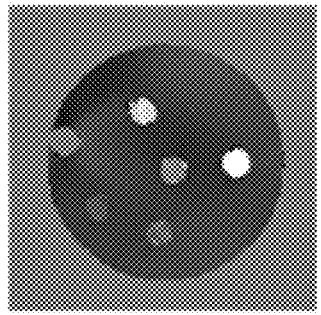
FIGS. 4E-H respectively shows an example susceptibility $\chi_L$ using the Diff, DiffGT, DiffGT-DBC, and DiffGT-NBC methods. The background variation is largely reduced.
Figure 4E:
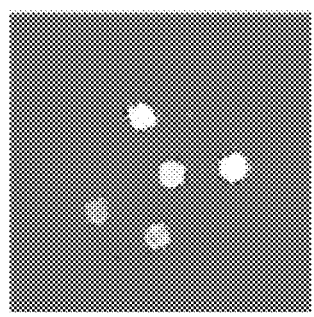
Figure 4F:
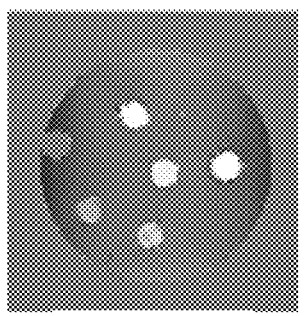
Figure 4G:
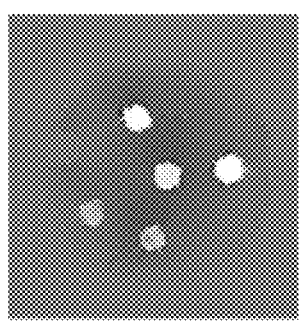
Figure 4H:
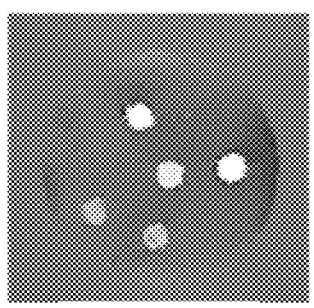

With the definition of discrete dipole convolution and Laplacian provided above, we now express the discrete data fidelity term in Eq. 10 as: $\|M(P\chi_L-Lf)\|_2^2$, here M is a diagonal matrix representing a binary mask with ones denoting regions where Lf can be faithfully evaluated and zeros otherwise. It should be noted that the binary mask M, in some cases, may be smaller than the original region of interest Ω, depending on the radius of the discrete Laplace operator as illustrated in FIG. 3.

In MRI, the measured f is often wrapped due to finite dynamic range and always contaminated by noise n, which is modeled as a multivariate random variable. Beside the unwrapping through the finite difference implementation described in 3.2, there are many techniques that can be used to impose continuity or smoothness in phase unwrapping, typically via path finding (including non-continuous path, residual balancing, or branch cut) or global error minimization (least squares, Laplace's unwrapping). A robust and fast method from the path finding category is the image quality guided region growth algorithm, which has been found to work well with MRI data using signal-to-noise ratio (SNR) as the image quality guidance. There are a number of approaches to take the noise into account. Before going into details, a brief analysis of the noise behavior in MRI will set ground for the following specific methods.

It is generally assumed that independently and identically distributed (i.i.d.) zero-mean Gaussian noise exists in both the real and imaginary parts of the complex MRI signal. In QSM, it is the signal phase that is of interest. Although the phase noise n has a complicated distribution in general, it may be approximated as a random variable uniformly distributed between $[-\pi, \pi)$ when the signal-to-noise ratio (SNR) is low (e.g., SNR<1). When the SNR is high (e.g., SNR>5), the phase noise n may be approximated as additive zero-mean independent Gaussian noise whose covariance matrix $\Psi = \text{diag}[\text{vec}(1/\text{SNR}(r)^2)]$, where SNR(r) denotes the SNR of the voxel at a spatial location r and may vary from location to location. To whiten this spatially varying noise ε, a weighting matrix $W = \Psi^{-1/2} = \text{diag}[\text{vec}(\text{SNR}(r))]$ needs to be applied.

3.3.1. a. Noise Whitening on Lf

Unfortunately, the Laplace operator changes the noise property on Lf. After the linear transformation L, the covariance matrix for noise n' on Lf becomes $\Psi' = L\Psi L^T$, and the noise whitening matrix $W' = \Psi'^{-1/2}$. So the data fidelity term needs to be adjusted accordingly:

$$\|MW'(P\chi_L - Lf)\|_2^2. \quad \text{Eq. 16}$$

One practical concern in evaluating W' is that, since $\Psi'$ has off diagonal elements, $W' = \Psi'^{-1/2}$ may not be easily diagonalizable, preventing efficient calculation. However, $\Psi$ is a diagonal matrix in standard MRI and both $L^T$ and L are diagonally dominant, so $\Psi'$ is also diagonally dominant and may be approximated using its diagonal elements only, e.g., the variance of n'.

When using the discrete Laplace operator, any point r on Lf is a linear combination of its neighbors on f, i.e. $(Lf)(r) = \Sigma_{r'} a(r') f(r+r')$. Therefore, the variance of n' at the same location is $\sigma_{n'}^2 = \Sigma_{r'} a(r')^2 \sigma_n^2(r+r')$, where $\sigma_n^2(r) = 1/\text{SNR}(r)^2$ is the variance of n on f. This formulation also suggests that the new noise variance can be efficiently calculated through a convolution. Thus, $\Psi'$ is approximated as $\text{diag}(\sigma_{n'}^2)$, and $W' = \Psi'^{-1/2} = \text{diag}[\text{vec}(1/\sigma_{n'})]$.

3.3.2. b. Noise Whitening on f—High SNR Case

From previous analyses in 0, f and its non-harmonic component $f_{nh}(r) = \int_\Omega \nabla^2 f(r')/|r-r'| dr' = \nabla^2 f|_\Omega * 1/r$ have the same noise characteristics. Therefore, we construct a new data fidelity term to minimize any discrepancy with respect to $f_{nh}$:

$$\|WM(GMP\chi_L - GMLf)\|_\Omega^2. \quad \text{Eq. 17}$$

Here, MLf represents $\nabla^2 f|_\Omega$, and G is the matrix representation of convolution with 1/r. Note that the noise whitening matrix W is readily available in the measured field data f. Ideally, $G = L^{-1}$ such that LG is an identity matrix, corresponding to its counterpart in continuous space $\nabla^2(1/r) = -4\pi\delta(r)$. $L^{-1}$ can be calculated as $L^{-1} = F^{-1} \text{diag}[\text{vec}(-1/k^2)]F$ or $L^{-1} = F^{-1} \text{diag}[\text{vec}(1/F(\mathcal{L}))]F$. In practice, there may be large eigenvalues close to the center of Fourier space, making the numerical calculation unstable. Therefore, a dampening function such as a high-pass filter H may be applied in G to ensure numerical stability: $G = HL^{-1}$. A variety of window functions can be used to construct the high-pass filter, such as rectangle function, Gaussian window, Hann window, Hamming window, Poisson window, etc.

3.3.3. c. Noise Whitening on f Through $e^{-if}$ in Complex Plane—Low SNR Case

As noise in MRI signal is in general Gaussian in the complex domain, the noise can also be whitened in the complex plane directly by minimizing the following non-linear data fidelity terms:

$$\|MW'(e^{-iP\chi_L} - e^{-iLf})\|_2^2, \quad \text{Eq. 18}$$

and $$\|MW(e^{-iGMP\chi_L} - e^{-iGMLf})\|_2^2 \quad \text{Eq. 19}$$

where $i = \sqrt{-1}$. It is noted that Eq. 19 is equivalent to $\|MWe^{-i(f-GMLf)}(e^{-iGMP\chi_L} - e^{-iGMLf})\|_\Omega^2 = \|MW(e^{-i(GMP\chi_L + f - GMLf)} - e^{-if})\|_\Omega^2$. In the expression, the measurement $We^{-if}$ may be the original complex MRI signal with i.i.d. zero-mean Gaussian noise, where the least-squares fitting yields a statistically optimal solution. Non diagonal noise whitening matrix W can be used in the case of parallel imaging of multiple coils with accelerating factor larger than 1.

When multiple orientation data is available, the data fidelity term can be similarly generated for each of the orientations. For multiple echo time data, the signal model exemplified by Eqs. 18 and 19 may be extended to image data for all each times or may be applied to a composite image. For tissue involving fat, the signal model can be further extended to include a chemical shift factor, which can be separated in the minimization process using prior knowledge of fat resonance frequency offset and spatial smoothness of susceptibility field.

3.4. V) Evaluation of the Regularization Term

After setting up a data fidelity term, the process 200 continues by setting up a regularization term (step 230).

A variety of regularization strategies is applicable.

In an example implementation:

$$R(\chi_L) = \|W_G \Phi \chi_L\|_p^p, \quad \text{Eq. 20}$$

where $\Phi$ is a feature extraction operator, which can be an identity matrix, a gradient operator, a Laplace operator, or wavelet transform; $W_G$ is the weighting matrix; $\|s\|_p$ is the Lp norm of s defined as $\|s\|_p = (\Sigma_i |s_i|^p)^{1/p}$, and $1 \leq p \leq 2$.

In its simplest form, $W_G$ can be an identity matrix. However, to take advantage of the complex MRI data, $W_G$ can be used to encode anatomical information. For example, $W_G$ can be derived from the amplitude component of the complex MRI signal A(r), where $W_G = 0$ for $|\Phi A(r)| > $threshold and $W_G = 1$ otherwise.

In another example implementation, $$R(\chi_L) = \|\chi_L\|_{wTV}, \quad \text{Eq. 21}$$

where $\|s\|_{wTV}$ is the weighted total variation of s defined as $\|s\|_{wTV} = $ $$\Sigma_i w_i \sqrt{\left(\frac{\partial s}{\partial x}\right)_i^2 + \left(\frac{\partial s}{\partial y}\right)_i^2 + \left(\frac{\partial s}{\partial z}\right)_i^2},$$

where $w_i$ could be used to incorporate anatomical information, i.e., $w_i=0$ for edges and 1 otherwise. When $w_i=1$, $\|s\|_{wTV}$ is equivalent to the canonical total variation norm.

In another example implementation, $$R(\chi_L) = \|W_G \Phi \chi_L\|_p^p + b\|\chi_L\|_{wTV}, \quad \text{Eq. 22}$$

3.5. IV) Evaluation of the Boundary Term

After setting up a regularization term, the process 200 may continue by setting up a boundary term (step 240).

In an example implementation, a Dirichlet boundary condition term $\|\chi_L - \chi_{L0}\|_{\partial\Omega}^2$ can be implemented as:

$$\|M_S(\chi_L - \chi_{L0})\|_2^2, \quad \text{Eq. 23}$$

where $M_S$ is a binary mask denoting the regions where true susceptibility $\chi_{L0}$ is assumed to be known, such as the surface of $\Omega$.

In human brain imaging, the cerebrospinal fluid (CSF) in the subarachnoid space encloses the brain parenchyma and may assume a constant susceptibility of −9.04 parts per million (ppm) if vacuum is chosen to be the reference, or 0 ppm if water is chosen to be the reference. The CSF in the ventricle may also be used to enforce constant values inside the brain. The CSF may be segmented manually or automatically. The CSF has long T1 relaxation time and long T2 relaxation time compare to normal brain tissue, so it appears hypointense on T1 weighted images and hyperintense on T2 weighted images, allowing for visual distinction. In imaging situations where $\chi_{L0}$ is unavailable in $M_S$, constant susceptibility may be assigned.

In another example implementation, a Neumann boundary condition term $\|\chi_L - \chi_{L0}\|_{\partial\Omega}^2$ can be implemented as:

$$\left\|M_S\left(N \nabla \chi_L - \frac{\partial \chi_{L0}}{\partial n}\right)\right\|_2^2, \quad \text{Eq. 24}$$

where N is the matrix representation of the normal direction n of the boundary and $\nabla$ is the gradient operator. n can be efficiently obtained by constructing a function F(x, y, z), which returns the distance between (x, y, z) and the nearest pixel in $\overline{\Omega}$. So F(x, y, z)=0 denotes the surface of $\Omega$, then the normal direction at a point (x, y, z) on the surface is given by $\nabla F(x, y, z)$.

$$\frac{\partial \chi_{L0}}{\partial n}$$

is the directional derivative of susceptibility on the surface along the normal direction of the surface. When $$\frac{\partial \chi_{L0}}{\partial n}$$

is unavailable, it is set to zero.

In some implementations, the boundary term can be established, as described above, each time the process 200 is performed. For example, in some cases, each time the process 200 is performed to process one or more sets of MR data, boundaries terms can be established based on one or more of the above described techniques. In some implementations, the boundary term can be established selectively (e.g., on a case by case basis). As an example, in some instances where the process 200 is performed, the boundary term can be established, while in other instances where the process 200 is performed, the boundary term might be established. In some cases, the process 200 can be performed two or more times, where at least one performance of the process 200 includes the establishing of a boundary term and at least one performance of the process 200 does not include the establishing of a boundary term. The results of each performance of the process 200 can be subsequently compared to determine if establishing a boundary term improves the result. In some cases, this can be determined experimentally (e.g., by processing MR data corresponding to subjects of a known distribution of magnetic susceptibility).

3.6. VI) Solver

After setting up a boundary term (if needed), the process 200 continues by minimizing the energy function (step 250).

One way to minimize energy functions, such as the ones shown in Eqs. 11, 12, Eq. 14, and 15 is to use the Newton type of method, such as the Newton method for linear data fidelity term with approximate derivatives for the L1 norm for the regularization term, and the Gauss-Newton Method for the nonlinear data fidelity term. In this technique, the solution $\chi$ is iteratively updated. In the nth iteration, the new solution $\chi^{(n+1)} = \chi^{(n)} - H^{-1}g$, where H denotes the Hessian matrix and g is the gradient direction of the energy function. Where the inverse Hessian applied to the gradient can be solved efficiently using conjugate gradient algorithm. Since the energy function E is expressed as a linear combination of several terms, its Hessian and gradient is also the linear combination of the Hessian and gradient of these terms. The Hessian and gradient of these individual terms are listed in Tables 1 and 2 below.

TABLE 1

Gradient of the energy function

| Data fidelity term | gradient g |
|---|---|
| $\|MW'(P\chi_L - Lf)\|_2^2$ | $\underline{W} \stackrel{def}{=} MW'$, $\underline{D} \stackrel{def}{=} P$, $\underline{b} \stackrel{def}{=} Lf$ <br> $2(\underline{WD}^T\underline{W}(\underline{D}\chi_L^{(n)} - \underline{b})$ |
| $\|MW(GMP\chi_L - GMLf)\|_2^2$ | $\underline{W} \stackrel{def}{=} MW$, $\underline{D} \stackrel{def}{=} GMP$, $\underline{b} \stackrel{def}{=} GMLf$ <br> $2(\underline{WD}^T\underline{W}(\underline{D}\chi_L^{(n)} - \underline{b})$ |
| $\|MW'(e^{-iP\chi_L} - e^{-iLf})\|_2^2$ | $\underline{W} \stackrel{def}{=} MW'e^{-iP\chi_L(n)}$, <br> $\underline{D} \stackrel{def}{=} P$, $\underline{b} \stackrel{def}{=} MW'e^{iLf}$ <br> $2\text{real}[(i\underline{WD})^H(\underline{W} - \underline{b})]$ |
| $\|MW(e^{-iGMP\chi_L} - e^{-iGMLf})\|_2^2$ | $\underline{W} \stackrel{def}{=} MWe^{-iGMP\chi_L(n)}$, <br> $\underline{D} \stackrel{def}{=} GMP$, <br> $\underline{b} \stackrel{def}{=} MWe^{iGMLf}$ <br> $2\text{real}[(i\underline{WD})^H(\underline{W} - \underline{b})]$ |
| Boundary term | |
| $\|M_S(\chi_L - \chi_{L0})\|_2^2$ | $2M_S^T M_S(\chi_L^{(n)} - \chi_{L0})$ |

TABLE 1-continued

Gradient of the energy function

| | gradient g |
|---|---|
| $\left\|M_S\left(N\nabla\chi_L - \frac{\partial\chi_{L0}}{\partial n}\right)\right\|_2^2$ | $2(M_S N\nabla)^T M_S\left(N\nabla\chi_L^{(n)} - \frac{\partial\chi_{L0}}{\partial n}\right)$ |
| Regularization term | |
| $\|W_G\Phi\chi_L\|_p^p, 1 \leq p \leq 2$ | $(W_G\Phi)^T \text{diag}(|W_G\Phi\chi_L^{(n)}|^{p-2})W_G\Phi\chi_L^{(n)}$ |
| $\|\chi_L\|_{wTV}$ | $(\nabla)^T \text{diag}(w/|\nabla\chi_L^{(n)}|, w/|\nabla\chi_L^{(n)}|, w/|\nabla\chi_L^{(n)}|)\nabla\chi_L^{(n)}$ |

TABLE 2

Hessian of the energy function

| | Hessian H |
|---|---|
| Data fidelity term | |
| $\|MW'(P\chi_L - Lf)\|_2^2$ | $\underline{W} \stackrel{def}{=} MW', \underline{D} \stackrel{def}{=} P$ |
| | $2(\underline{WD})^T \underline{WD}$ |
| $\|MW(GMP\chi_L - GMLf)\|_2^2$ | $\underline{W} \stackrel{def}{=} MW, \underline{D} \stackrel{def}{=} GMP$ |
| | $2(\underline{WD})^T \underline{WD}$ |
| $\|MW'(e^{-iP\chi_L} - e^{-iLf})\|_2^2$ | $\underline{W} \stackrel{def}{=} MW' e^{-iP\chi_L^{(n)}}$ |
| | $\underline{D} \stackrel{def}{=} DL$ |
| | $2(\underline{WD})^H \underline{WD}$ |
| $\|MW(e^{-iGMP\chi_L} - e^{-iGMLf})\|_2^2$ | $\underline{W} \stackrel{def}{=} MW e^{-iGMP\chi_L^{(n)}}$ |
| | $\underline{D} \stackrel{def}{=} GMP$ |
| | $2(\underline{WD})^H \underline{WD}$ |
| Boundary term | |
| $\|M_S(\chi_L - \chi_{L0})\|_2^2$ | $2M_S^T M_S$ |
| $\left\|M_S\left(N\nabla\chi_L - \frac{\partial\chi_{L0}}{\partial n}\right)\right\|_2^2$ | $2(M_S N\nabla)^T M_S N\nabla$ |
| Regularization term | |
| $\|W_G\Phi\chi_L\|_p^p, 1 \leq p \leq 2$ | $(W_G\Phi)^T \text{diag}(|W_G\Phi\chi_L^{(n)}|^{p-2})W_G\Phi$ |
| $\|\chi_L\|_{wTV}$ | $(\nabla)^T \text{diag}(w/|\nabla\chi_L^{(n)}|, w/|\nabla\chi_L^{(n)}|, w/|\nabla\chi_L^{(n)}|)\nabla$ |

4. Experiments

Implementations of the abovementioned techniques can be used in a variety of applications. As examples, the following section describes the application of one or more of these techniques to numerical simulation, phantom experiments, and human brain imaging.

4.1. I) Methods and Materials

4.1.1. a. Numerical Simulation

A 256×256×128 numerical brain phantom (FIG. 1A) was constructed. The simulated susceptibility $\chi_0$ values were 0.09, 0.19, 0.09, 0.07, 0.05, 0.00 and −0.05 ppm for the caudate nucleus, globus pallidus, putamen, thalamus, cortical gray matter, CSF and white matter. The field perturbation of the model was calculated using $D\chi_0$. The field was converted to gradient echo phase values assuming field strength (B0)=3T and echo time (TE)=20 ms. The noise standard deviation was set as 1 arbitrary unit (a.u.) and signal intensities were set to 68, 48, 71, 78, 80, 92, 80 and 72 a.u. for the caudate nucleus, globus pallidus, putamen, veins, thalamus, white matter, grey matter, other parenchyma and CSF, respectively. These values were empirically determined from in vivo human brain scans. The noise is simulated in real parts and imaginary parts independently.

4.1.2. b. Gadolinium Phantom Experiments

A 2% agarose gel phantom containing five balloons of gadolinium solution (Magnevist, Berlex Labrotories, Wayne, N.J.) was constructed. The highest concentration of the gadolinium was 0.5% followed by two-fold dilutions, leading to susceptibility values of 0.8, 0.4, 0.2, 0.1, and 0.05 ppm. This phantom was scanned on a 3T scanner (HDx, GE healthcare, Waukesha, Wis.) using a multi-echo gradient echo sequence with the following parameters: 8 TEs evenly spaced between 5 and 40 ms; TR=70 ms; acquisition matrix=130×130×86; voxel size=1×1×1 mm³; flip angle=15°; bandwidth=480 Hz/pixel.

4.1.3. c. SPIO Phantom Experiments

We made a SPIO phantom containing 5 blocks of agarose gel doped with 15 nm super-paramagnetic iron oxide coated with Oleic acid (Ocean Nanotech, LLC, Springdale, Ark., USA), and surrounded by 2% agarose gel. The highest amount of iron oxide in the phantom was 100 μL×0.5 μg/μL, followed by 2-fold serial dilutions. Data were acquired at a 3.0T human MR scanners (HDx, GE Healthcare, Waukesha, Wis., USA). A 3D multi-echo spoiled gradient echo sequence was used to sample at different echo times (TE) in an interleaved manner with 4 TEs (3.8, 4.3, 6.3 and 16.3 ms). Other imaging parameters were: repetition time (TR)=22 ms; voxel size=0.5×0.5×0.5 mm³, matrix size=256×64×64; bandwidth (BW)=±31.25 kHz; flip angle=15°.

4.1.4. d. Human Brain Imaging

Five healthy volunteers were scanned using a 3D multi-gradient echo sequence on a 3T scanner (GE Excite HD), under approval by the Institutional Review Board. Imaging parameters were TE/ΔTE/#TE/TR/FA/BW/FOV/matrix size=5 ms/5 ms/8/50 ms/20°/±62.50 kHz/21.8×24×12.8 cm³/232×256×64. One of the volunteers was asked to reposition her head in the scanner in 12 different orientation for data acquisition to allow the QSM reconstruction using calculation of susceptibility through multiple orientation sampling (COSMOS).

One advantage of the differential QSM method is that it does not require additional spatial phase unwrapping, as the finite difference implementation of $\nabla^2 f$ allows corrections of $2\pi$ multiples to ensure differences between neighboring voxels are in $(-\pi,\pi]$. Although excluding pure noise in signal void regions is still beneficial, skull stripping commonly used in current QSM methods is not required, which allows inclusion of more anatomical regions. In this example, all voxels with signal intensities greater than 10% of maximum signal intensity in the magnitude image were included.

4.1.5. e. Comparison of Various QSM Reconstruction Methods

The following energy functions were included in the comparison:

Integration method (Intg):

$$\|MW(e^{-iD\chi_L} - e^{-if^L})\|_2^2 + \alpha\|W_G\nabla\chi_L\|_1;$$

Intg with DBC (Intg-DBC):

$$\|MW(e^{-iD\chi_L} - e^{-if^L})\|_2^2 + \alpha\|W_G\nabla\chi_L\|_1 + \beta\|M_S(\chi_L - \chi_{L0})\|^2$$

Differential Method (Diff):

$$\|MW'(e^{-iP\chi_L} - e^{-iLf})\|_2^2 + \alpha\|W_G\nabla\chi_L\|_1;$$

Diff with Green's Theorem (DiffGT):

$$\|MW(e^{-iGMP\chi_L}-e^{-iGMLf})\|_2^2+\alpha\|W_G\nabla\chi_L\|_1;$$

DiffGT with DBC (DiffGT-DBC):

$$\|MW(e^{-iGMP\chi_L}-e^{-iGMLf})\|_2^2+\alpha\|W_G\nabla\chi_L\|_1+\beta\|M_S(\chi_L-\chi_{L0})\|^2;$$

DiffGT with NBC (DiffGT-NBC):

$$\|MW(e^{-iGMP\chi_L}-e^{-iGMLf})\|_2^2+\alpha\|W_G\nabla\chi_L\|_1+\gamma\left\|M_s\left(N\nabla\chi_L-\frac{\partial\chi_{L0}}{\partial n}\right)\right\|^2.$$

For the volunteer with 12 orientation sampling, the following two energy functions were included:
Integration COSMOS (Intg-COSMOS)

$$\Sigma_{\theta=1}^N\|MW(D_\theta\chi_L-f_{L,\theta})\|_2^2;$$

Differential COSMOS (Diff-COSMOS)

$$\Sigma_{\theta=1}^N\|MW(GMD_\theta L\chi_L-GMLf_\theta)\|_2^2.$$

In the experiments, $\alpha=10^{-3}\sim10^{-2}$, $\beta=10^3$ and $\gamma=10^3$ were used. SMV with a radius=5 mm were used in Diff to approximate the Laplace operator. Finite difference with neighboring voxels was used to approximate the Laplace operator in DiffGT, DiffGT-DBC, and DiffGT-NBC.

4.2. II) Results
4.2.1. a. Numerical Simulation

The simulation results are shown in FIG. 1D-I. It is demonstrated that remnant background field propagated to the estimated susceptibility distribution in Intg and Intg-DBC (FIG. 1D-E), and this artifact was successfully suppressed in Diff, DiffGT, DiffGT-DBC and DiffGT-NBC (FIG. 1F-I). Quantitatively, the relative error defined as $\|\chi^*_L-\chi_{L0}\|_2/\|\chi_{L0}\|_2$ is summarized in Table.

4.2.2. b. Gadolinium Phantom Experiments

The phantom results are shown in FIG. 4. It confirmed that even when minimal remnant background field was presented in the local field (FIG. 4B), noticeable signal variations are still observed originating from the high susceptibility balloons and the boundary of the water phantom using Intg and Intg-DBC (FIGS. 4C&D), and this artifact was markedly reduced using Diff, DiffGT, DiffGT-DBC and DiffGT-NBC (FIG. 4E-H) Quantitatively, the slope of the linear regression between prepared and measured susceptibility is summarized in Table.

c. SPIO Phantom Experiments

The phantom results are shown in FIG. 5. In agreement with the Gadolinium phantom experiments, it is confirmed that Diff, DiffGT, DiffGT-DBC and DiffGT-NBC is more effective in eliminating background signal variation than Intg and Intg-DBC. Quantitatively, the slope of the linear regression between prepared and measured susceptibility is summarized in Table 3.

d. Human Brain Imaging

The human brain imaging results are shown in FIG. 6. It is demonstrated again that remnant background field (FIG. 6b) propagated to the susceptibility map (FIGS. 6C&D) in Intg and Intg-DBC, and were reduced in Diff, DiffGT, DiffGT-DBC and DiffGT-NBC (FIG. 6E-H).

The COSMOS reconstructed human brain is shown in FIG. 7. It is confirmed that remnant background field (FIG. 7B) propagated to the Intg-COSMOS (FIG. 7C) and the artifact was suppressed in Diff-COSMOS (FIG. 7D).

5. Discussion

When background field is poorly estimated, the exemplary differential QSM techniques shown above are superior to existing QSM techniques. This is especially apparent near air tissue interfaces, where existing QSM techniques have resorted to region of interest erosion by removing voxels with poorly estimated local field. In these examples, all QSM techniques included here provided similar susceptibility mapping in regions far from region of interest boundaries. In some cases, differential QSM may be preferred for mapping the cortex, superior sagittal sinus and other brain surface regions. When combined with fat-water separation, the differential QSM may allow mapping of susceptibility in the body.

TABLE 3

Quantitative comparison of various reconstruction methods

| | Numerical simulation Relative error | Gadolinium phantom | SPIO phantom |
|---|---|---|---|
| | | Slope of linear regression | |
| Intg | 1094% | 0.96 | 0.89 |
| Intg-DBC | 3803% | 0.96 | 0.89 |
| Diff | 46% | 0.93 | 0.90 |
| DiffGT | 21% | 1.00 | 1.13 |
| DiffGT-DBC | 14% | 1.00 | 1.01 |
| DiffGT-NBC | 18% | 0.94 | 1.04 |

In some cases, one or more of the above quantitative susceptibility mapping techniques can be implemented using the process 800 shown in FIG. 8. As an example, the process 800 can be used to map the tissue magnetic susceptibility of a subject, such as a patient (or portion of a patient) or an experimental sample (e.g., an imaging phantom, a sample of material or tissue, and so forth).

In some implementations, the process 800 can be used to transform MR signal data corresponding to a subject into susceptibility-based images that quantitatively depict the structure and/or composition of the subject. As an example, in some cases, the process 800 can be used to obtain MR data corresponding a subject, and process this MR data to generate a quantitative susceptibility map of the subject. Using this quantitative susceptibility map, one or more susceptibility-based images of the subject can be generated and displayed to a user. The user can then use these images for diagnostic or experimental purposes, for example to investigate the structure and/or composition of the subject, and/or to diagnose various conditions or diseases based, at least in part, on the images. As the process 800 can result in susceptibility-based images having higher quality and/or accuracy compared to other susceptibility mapping techniques, implementations of the process 800 can be used to improve a user's understanding of a subject's structure and/or composition, and can be used to improve the accuracy of any resulting medical diagnoses or experimental analyses.

The process 800 begins by acquiring magnetic resonance (MR) data corresponding to a subject (step 810). In some cases, the MR data can correspond to a patient (e.g., the entirety of a patient or a portion of a patient, such as a particular portion to the patient's body). In some cases, the MR data can correspond to one or more samples (e.g., an imaging phantom, a sample of one or more materials, a sample of one or more types of tissue, and/or one or more other objects).

In some implementations, the MR data can be acquired using an MRI scanner using one or more suitable pulse sequences. As an example, in some cases, MR data can be acquired using a gradient echo sequence that acquires MR data at a single echo time or at multiple echo times (e.g., two, three, four, five, and so forth). Various scan parameters can be used. As another example, MR data can be obtained using a 3D multi-echo spoiled gradient echo sequence on a 3T scanner (e.g., a GE Excite HD MR scanner) using a pulse sequence that samples at different echo times (TE) (e.g., 4 TEs, such as 3.8, 4.3, 6.3 and 16.3 ms) in an interleaved manner, and with following imaging parameters: repetition time (TR)=22 ms; voxel size=0.5×0.5×0.5 mm$^3$, matrix size=256×64×64; bandwidth (BW)=±31.25 kHz; flip angle=15°. As another example, MR data can be obtained using a 3D multi-gradient echo sequence on a 3T scanner using imaging parameters TE/ΔTE/#TE/TR/FA/BW/FOV/matrix size=5 ms/5 ms/8/50 ms/20°/±62.50 kHz/21.8×24×12.8 cm$^3$/232×256×64. Although an example sequences and example parameters are described above, these are merely illustrative. In practice, other sequences and parameters can be used, depending on various factors (e.g., the size of region to be examined, a known or assumed range of susceptibility values of the subject, scan time considerations, device limitations, and so forth).

After acquiring MR data corresponding to a subject, the process 800 continues by determining a magnetic field based on the MR data (step 820). The magnetic field can be, for example, a magnetic field map that describes the magnitude and/or direction of the magnetic field in a particular region (e.g., a volume that is being examined). As noted above, in some cases, the magnetic field can include a local magnetic field distribution (e.g., $f_L$) superimposed on a background magnetic field distribution (e.g., $f_B$), where the local magnetic field distribution corresponds to the magnetic susceptibility distribution of the subject.

The magnetic field can be determined from MR data phase or the complex MR data by fitting the detected signal phase as a linear function of time with the gyromagnetic ratio times the magnetic field as the linearity coefficient. This fitting for a complex phase factor can be performed on each voxel using a Gauss-Newton method. In the case of large signal-to-noise ratio, this complex phase factor fitting is reduced to a linear fitting. The output field can be unwrapped by imposing spatial continuity, such as using an image quality guided region growth technique.

As an example, for a single echo dataset, the phase signal of the dataset can be treated as a map of the magnetic field. Thus, the magnetic field can be estimated by using the phase signal of a signal echo dataset directly as the magnetic field. As another example, when multiple echoes are acquired, the magnetic field map can estimated from the phase evolution. This can be performed, for example, either by performing a linear least squares fitting on the temporally unwrapped phase data, or by performing a nonlinear least square fitting on the complex MR dataset. The latter allows the field map estimation in the presence of more than one species contributing to MRI phase evolution.

Sometimes, there are spatial wrappings on the field map due to either long echo or long echo spacing. In such cases, a spatial phase unwrapping can be performed to resolve these ambiguities.

After determining the magnetic field based on the MR data, the process 800 continues by determining a relationship between the magnetic field and magnetic susceptibility (step 830). As described above, in some implementations, the relationship between the magnetic field and magnetic susceptibility can be expressed as a relationship between the magnetic field at a given location to the magnetic susceptibility at that location (see, e.g., Eqs. 1, 3, 5, and 6). In some cases, this relationship can be expressed in integral form (see, e.g., Section 1.1), or in differential form (see, e.g., Section 1.2). In the differential form, the relationship between the magnetic field at a given location to the magnetic susceptibility at that location can equate a Laplacian of the magnetic field with one third of the Laplacian of the magnetic susceptibility minus a second order derivative of the magnetic susceptibility (see, e.g., Eq. 6).

After determining a relationship between the magnetic field and magnetic susceptibility, the process 800 continues by performing a convolution operation on the relationship between the magnetic field and the magnetic susceptibility to obtain a noise property (step 840). As described above, in some implementations, the convolution operation can be performed according to Eqs. 9, 11, 12, 14, 15, 17, 19, and as described in Sections 2.2 and 3.3. As noted above, in some cases, the noise property can correspond to noise in the magnetic field (see, e.g., Section 2.1 above). This noise can be, for example, noise that was introduced into the MR data during signal acquisition (e.g., measurement noise). In some cases, a noise property is obtained that is appropriate for least squares fitting, such that the process 800 can be performed numerically (see, e.g., Section 3).

In some cases, performing the convolution operation comprises convolving a Green's function with the relationship between the magnetic field at a given location to the magnetic susceptibility at that location (see, e.g., Eqs. 9, 11, 12, 14, 15, 17, and 19, and Sections 2.1 2.2.1 above). In some cases, performing the convolution operation comprises convolving 1/r with the relationship between the magnetic field at a given location to the magnetic susceptibility at that location, where r is a distance from an origin in a three dimension space (see, e.g., Eq. 8). In some cases, r can be defined as the distance from a source of susceptibility to the magnetic field observation point.

After performing the convolution operation on the relationship between the magnetic field and the magnetic susceptibility to obtain a noise property, the process 800 continues by estimating a magnetic susceptibility distribution of the subject based, at least in part, on the noise property (step 850). As described above, estimating the susceptibility distribution of the subject can include determining a cost function corresponding to a susceptibility distribution, the magnetic field, a mask corresponding to a region of interest, and a Green's function. In some cases, the cost function can also include a convolution of the Green's function, the mask corresponding to the region of interest, and a partial differential of the susceptibility distribution. An example of this is shown, for example, in Eqs 17 and 19, where G is a Green's function, M is a mask, and P is a partial differential. As described above, a variety of cost functions can be used to account for a variety of different factors and conditions. For instance, example cost functions are shown in Eqs. 9-22 (see, e.g., as well as in Sections 2.2 and 3.3). The estimated susceptibility distribution of the subject can be determined by identifying a particular susceptibility distribution that minimizes one or more of these cost functions. As described above, in some cases, this can be determined numerically (see, e.g., Section 3.6).

After estimating a magnetic susceptibility distribution of the subject, the process 800 continues by generating one or more images of the subject based on the estimated susceptibility distribution of the subject (step 860). These images can be electronically displayed on a suitable display device (e.g., an LCD display device, LED display device, CRT display device, or other display device that can be configured to show images) and/or physically displayed on a suitable medium (e.g., printed, etched, painted, imprinted, or otherwise physically presented on a sheet or paper, plastic, or other material).

In some cases, the estimated susceptibility distribution of the subject can be visualized using a color scale, where each of several colors is mapped to a particular susceptibility value or range of susceptibility values. Accordingly, a two dimensional or three dimension image can be generated, where each pixel or voxel of the image corresponds to a particular spatial location of the subject, and the color of that pixel of voxel depicts the susceptibility value of the subject at that location.

In some cases, the color scale can include a gradient of colors and/or a gradient of gray shades (e.g., a gray scale), in order to depict a range of susceptibility values. In some cases, for a color scale that includes a gradient of colors or a gradient of gray shades, one end of the gradient can correspond to the lowest susceptibility value in a particular window of susceptibility values (e.g., an arbitrarily selected window of values), and the other end of the gradient can correspond to the highest susceptibility value in the window of values. For instance, for gray scale that includes a gradient of gray shades between pure white and pure black, pure white can be used to indicate the highest susceptibility value in a particular arbitrary window of values, and pure black can be used to indicate the lowest susceptibility value in the window of values. Other relationships between a color/gray scale and susceptibility values is also possible. For example, in some cases, for gray scale that includes a gradient of gray shades between pure white and pure black, pure white can be used to indicate the lower susceptibility value in a particular arbitrary window of values, and pure black can be used to indicate the highest susceptibility value in the window of values. Although the examples are described in the context of gray scales, in practice, similar relationships between color scales and susceptibility values are also possible.

Susceptibility values and colors can be mapped linearly (e.g., such that each absolute change in susceptibility value corresponds to a proportional change in color), logarithmically (e.g., such that each an exponential changes in susceptibility values correspond to a linear change in color), or according to any other mapping. Although examples mapping between color scales and susceptibility values are described above, these are merely illustrative examples. In practice, other mappings are also possible, depending on the implementation.

In some cases, the estimated susceptibility distribution can be regularized based on prior information regarding the subject. As an example, the estimated susceptibility distribution can regularized using one or more of the techniques described above (see, e.g., Sections 2.2.2, 3.4, and 3.5). In some cases, regularizing the estimated susceptibility distribution based on prior information regarding the subject comprises determining boundary conditions associated with the subject (see, e.g., Section 3.5)

Implementations of the above described techniques can be performed using a computer system. FIG. 9 is a block diagram of an example computer system 900 that can be used, for example, to perform implementations of the process 200 and 800. In some implementations, the computer system 900 can be communicatively connected to another computer system (e.g., another computer system 900), such that it receives data (e.g., MRI datasets), and analyzes the received data using one or more of the techniques described above.

The system 900 includes a processor 910, a memory 920, a storage device 930, and an input/output device 940. Each of the components 910, 920, 930, and 940 can be interconnected, for example, using a system bus 950. The processor 910 is capable of processing instructions for execution within the system 900. In some implementations, the processor 910 is a single-threaded processor. In some implementations, the processor 910 is a multi-threaded processor. In some implementations, the processor 910 is a quantum computer. The processor 910 is capable of processing instructions stored in the memory 920 or on the storage device 930. The processor 910 may execute operations such as performing one or more of the techniques described above.

The memory 920 stores information within the system 900. In some implementations, the memory 920 is a computer-readable medium. In some implementations, the memory 920 is a volatile memory unit. In some implementations, the memory 920 is a non-volatile memory unit.

The storage device 930 is capable of providing mass storage for the system 900. In some implementations, the storage device 930 is a non-transitory computer-readable medium. In various different implementations, the storage device 930 can include, for example, a hard disk device, an optical disk device, a solid-state drive, a flash drive, magnetic tape, or some other large capacity storage device. In some implementations, the storage device 930 may be a cloud storage device, e.g., a logical storage device including multiple physical storage devices distributed on a network and accessed using a network. In some examples, the storage device may store long-term data. The input/output device 940 provides input/output operations for the system 900. In some implementations, the input/output device 940 can include one or more of a network interface devices, e.g., an Ethernet card, a serial communication device, e.g., an RS-232 port, and/or a wireless interface device, e.g., an 802.11 card, a 3G wireless modem, a 4G wireless modem, etc. A network interface device allows the system 900 to communicate, for example, transmit and receive data. In some implementations, the input/output device can include driver devices configured to receive input data and send output data to other input/output devices, e.g., a keyboard, a mouse, a printer, a sensor (e.g., a sensor that measures component or system-related properties, a sensor that measures environmental-related properties, or other types of sensors), and a display device 960. In some implementations, mobile computing devices, mobile communication devices, and other devices can be used.

A computing system can be realized by instructions that upon execution cause one or more processing devices to carry out the processes and functions described above, for example, storing, maintaining, and displaying artifacts. Such instructions can include, for example, interpreted instructions such as script instructions, or executable code, or other instructions stored in a computer readable medium. A computing system can be distributively implemented over a network, such as a server farm, or a set of widely distributed servers or can be implemented in a single virtual device that includes multiple distributed devices that operate in coordination with one another. For example, one of the devices can control the other devices, or the devices may operate under a set of coordinated rules or protocols, or the devices may be coordinated in another fashion. The coordinated operation of the multiple distributed devices presents the appearance of operating as a single device.

Although an example processing system has been described in FIG. 5, implementations of the subject matter and the functional operations described above can be implemented in other types of digital electronic circuitry, or in computer software, firmware, or hardware, including the structures disclosed in this specification and their structural equivalents, or in combinations of one or more of them. Implementations of the subject matter described in this specification, such as performing one or more of the above described processes, can be implemented as one or more computer program products, e.g., one or more modules of computer program instructions encoded on a tangible program carrier, for example a computer-readable medium, for execution by, or to control the operation of, a processing system. The computer readable medium can be a machine readable storage device, a machine readable storage substrate, a memory device, a composition of matter effecting a machine readable propagated signal, or a combination of one or more of them.

The term "processing module" may encompass all apparatus, devices, and machines for processing data, including by way of example a programmable processor, a computer, or multiple processors or computers. A processing module can include, in addition to hardware, code that creates an execution environment for the computer program in question, e.g., code that constitutes processor firmware, a protocol stack, a database management system, an operating system, or a combination of one or more of them.

A computer program (also known as a program, software, software application, script, executable logic, or code) can be written in any form of programming language, including compiled or interpreted languages, or declarative or procedural languages, and it can be deployed in any form, including as a standalone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

Computer readable media suitable for storing computer program instructions and data include all forms of non-volatile or volatile memory, media and memory devices, including by way of example semiconductor memory devices, e.g., EPROM, EEPROM, and flash memory devices; magnetic disks, e.g., internal hard disks or removable disks or magnetic tapes; magneto optical disks; and CD-ROM and DVD-ROM disks. The processor and the memory can be supplemented by, or incorporated in, special purpose logic circuitry. Sometimes a server is a general purpose computer, and sometimes it is a custom-tailored special purpose electronic device, and sometimes it is a combination of these things. Implementations can include a back end component, e.g., a data server, or a middleware component, e.g., an application server, or a front end component, e.g., a client computer having a graphical user interface or a Web browser through which a user can interact with an implementation of the subject matter described is this specification, or any combination of one or more such back end, middleware, or front end components. The components of the system can be interconnected by any form or medium of digital data communication, e.g., a communication network. Examples of communication networks include a local area network ("LAN") and a wide area network ("WAN"), e.g., the Internet.

Certain features that are described above in the context of separate implementations can also be implemented in combination in a single implementation. Conversely, features that are described in the context of a single implementation can be implemented in multiple implementations separately or in any sub-combinations.

The order in which operations are performed as described above can be altered. In certain circumstances, multitasking and parallel processing may be advantageous. The separation of system components in the implementations described above should not be understood as requiring such separation.

A number of embodiments of the invention have been described. Nevertheless, it will be understood that various modifications may be made without departing from the spirit and scope of the disclosure. Accordingly, other embodiments are within the scope of the following claims.

What is claimed is:

1. A method for mapping tissue magnetic susceptibility, the method comprising:
   acquiring magnetic resonance (MR) data, wherein the MR data correspond to a subject;
   determining a magnetic field based on the MR data;
   determining a relationship between the magnetic field at a given location to the magnetic susceptibility at that location;
   performing a convolution operation on the relationship between the magnetic field at the given location to the magnetic susceptibility at that location to obtain a noise property;
   estimating a magnetic susceptibility distribution of the subject based, at least in part, on the noise property, wherein estimating the susceptibility distribution of the subject comprises:
      determining a cost function corresponding to a susceptibility distribution, the magnetic field, a mask corresponding to a region of interest, and a Green's function;
      determining a susceptibility distribution that minimizes the cost function; and
      identifying the susceptibility distribution that minimizes the cost function as the estimated susceptibility distribution of the subject; and
   generating one or more images of the subject based on the estimated susceptibility distribution of the subject.

2. The method of claim 1, wherein the relationship between the magnetic field at the given location to the magnetic susceptibility at that location equates a Laplacian of the magnetic field with one third of the Laplacian of the magnetic susceptibility minus a second order derivative of the magnetic susceptibility.

3. The method of claim 1, wherein performing the convolution operation comprises convolving a Green's function with the relationship between the magnetic field at the given location to the magnetic susceptibility at that location.

4. The method of claim 1, wherein performing the convolution operation comprises convolving $1/r$ with the relationship between the magnetic field at the given location to the magnetic susceptibility at that location, where $r$ is a distance from an origin in a three dimension space.

5. The method of claim 1, wherein the noise property corresponds to noise in the magnetic field.

6. The method of claim 1, wherein acquiring the MR data comprises acquiring the MR data at multiple echo times.

7. The method of claim 1, wherein acquiring the MR data comprises acquiring the MR data at a single echo time.

8. The method of claim 1, wherein the magnetic field comprises a local magnetic field distribution superimposed on a background magnetic field distribution, wherein the local magnetic field distribution corresponds to the magnetic susceptibility distribution of the subject.

9. The method of claim 1, wherein the cost function comprises a convolution of a Green's function, the mask corresponding to the region of interest, and a Laplacian of the magnetic field.

10. The method of claim 9, wherein the cost function further comprises a convolution of the Green's function, the mask corresponding to the region of interest, and a partial differential of the susceptibility distribution.

11. The method of claim 1, wherein determining a susceptibility distribution that minimizes the cost function comprises performing a least squares fitting based, at least in part, on the noise property.

12. The method of claim 1, further comprising regularizing the estimated susceptibility distribution based on prior information regarding the subject.

13. The method of claim 12, wherein regularizing the estimated susceptibility distribution based on prior information regarding the subject comprises determining boundary conditions associated with the subject.

14. A system for mapping tissue magnetic susceptibility, the system comprising:
a processing module, wherein the processing module is operable to:
acquire magnetic resonance (MR) data, wherein the MR data correspond to a subject;
determine a magnetic field based on the MR data;
determine a relationship between the magnetic field at a given location to the magnetic susceptibility at that location;
perform a convolution operation on the relationship between the magnetic field at the given location to the magnetic susceptibility at that location to obtain a noise property;
estimate a magnetic susceptibility distribution of the subject based, at least in part, on the noise property, wherein estimating the susceptibility distribution of the subject comprises:
determining a cost function corresponding to a susceptibility distribution, the magnetic field, a mask corresponding to a region of interest, and a Green's function;
determining a susceptibility distribution that minimizes the cost function; and
identifying the susceptibility distribution that minimizes the cost function as the estimated susceptibility distribution of the subject; and
generate one or more images of the subject based on the estimated susceptibility distribution of the subject.

15. The system of claim 14, wherein the relationship between the magnetic field at the given location to the magnetic susceptibility at that location equates a Laplacian of the magnetic field with one third of the Laplacian of the magnetic susceptibility minus a second order derivative of the magnetic susceptibility.

16. The system of claim 14, wherein performing the convolution operation comprises convolving a Green's function with the relationship between the magnetic field at the given location to the magnetic susceptibility at that location.

17. The system of claim 14, wherein performing the convolution operation comprises convolving 1/r with the relationship between the magnetic field at the given location to the magnetic susceptibility at that location, where r is a distance from an origin in a three dimension space.

18. The system of claim 14, wherein the noise property corresponds to noise in the magnetic field.

19. The system of claim 14, wherein acquiring the MR data comprises acquiring the MR data at multiple echo times.

20. The system of claim 14, wherein acquiring the MR data comprises acquiring the MR data at a single echo time.

21. The system of claim 14, wherein the magnetic field comprises a local magnetic field distribution superimposed on a background magnetic field distribution, wherein the local magnetic field distribution corresponds to the magnetic susceptibility distribution of the subject.

22. The system of claim 14, wherein the cost function comprises a convolution of a Green's function, the mask corresponding to the region of interest, and a Laplacian of the magnetic field.

23. The system of claim 22, wherein the cost function further comprises a convolution of the Green's function, the mask corresponding to the region of interest, and a partial differential of the susceptibility distribution.

24. The system of claim 14, wherein determining a susceptibility distribution that minimizes the cost function comprises performing a least squares fitting based, at least in part, on the noise property.

25. The system of claim 14, wherein the processing module is further operable to regularize the estimated susceptibility distribution based on prior information regarding the subject.

26. The system of claim 25, wherein regularizing the estimated susceptibility distribution based on prior information regarding the subject comprises determining boundary conditions associated with the subject.

27. A non-transitory computer storage medium encoded with a computer program, the program comprising instructions that when executed by data processing apparatus cause the data processing apparatus to perform operations comprising:
acquiring magnetic resonance (MR) data, wherein the MR data correspond to a subject;
determining a magnetic field based on the MR data;
determining a relationship between the magnetic field at the given location to the magnetic susceptibility at that location;
performing a convolution operation on the relationship between the magnetic field at a given location to the magnetic susceptibility at that location to obtain a noise property;
estimating a magnetic susceptibility distribution of the subject based, at least in part, on the noise property, wherein estimating the susceptibility distribution of the subject comprises:
determining a cost function corresponding to a susceptibility distribution, the magnetic field, a mask corresponding to a region of interest, and a Green's function;
determining a susceptibility distribution that minimizes the cost function; and identifying the susceptibility distribution that minimizes the cost function as the estimated susceptibility distribution of the subject; and generating one or more images of the subject based on the estimated susceptibility distribution of the subject.

28. The non-transitory computer storage medium of claim 27, wherein the relationship between the magnetic field at the given location to the magnetic susceptibility at that location equates a Laplacian of the magnetic field with one third of the Laplacian of the magnetic susceptibility minus a second order derivative of the magnetic susceptibility.

29. The non-transitory computer storage medium of claim 27, wherein performing the convolution operation comprises convolving a Green's function with the relationship between the magnetic field at the given location to the magnetic susceptibility at that location.

30. The non-transitory computer storage medium of claim 27, wherein performing the convolution operation comprises convolving 1/r with the relationship between the magnetic field at the given location to the magnetic susceptibility at that location, where r is a distance from an origin in a three dimension space.

31. The non-transitory computer storage medium of claim 27, wherein the noise property corresponds to noise in the magnetic field.

32. The non-transitory computer storage medium of claim 27, wherein acquiring the MR data comprises acquiring the MR data at multiple echo times.

33. The non-transitory computer storage medium of claim 27, wherein acquiring the MR data comprises acquiring the MR data at a single echo time.

34. The non-transitory computer storage medium of claim 27, wherein the magnetic field comprises a local magnetic field distribution superimposed on a background magnetic field distribution, wherein the local magnetic field distribution corresponds to the magnetic susceptibility distribution of the subject.

35. The non-transitory computer storage medium of claim 27, wherein the cost function comprises a convolution of a Green's function, the mask corresponding to the region of interest, and a Laplacian of the magnetic field.

36. The non-transitory computer storage medium of claim 35, wherein the cost function further comprises a convolution of the Green's function, the mask corresponding to the region of interest, and a partial differential of the susceptibility distribution.

37. The non-transitory computer storage medium of claim 27, wherein determining a susceptibility distribution that minimizes the cost function comprises performing a least squares fitting based, at least in part, on the noise property.

38. The non-transitory computer storage medium of claim 27, wherein the operations further comprise regularizing the estimated susceptibility distribution based on prior information regarding the subject.

39. The non-transitory computer storage medium of claim 38, wherein regularizing the estimated susceptibility distribution based on prior information regarding the subject comprises determining boundary conditions associated with the subject.

* * * * *